(12) United States Patent
Moon et al.

(10) Patent No.: US 7,518,172 B2
(45) Date of Patent: Apr. 14, 2009

(54) IMAGE SENSOR HAVING IMPROVED SENSITIVITY AND DECREASED CROSSTALK AND METHOD OF FABRICATING SAME

(75) Inventors: Chang-rok Moon, Seocho-gu (KR); Yun-hee Lee, Yongin-si (KR); Jong-wan Jung, Hwaseong-si (KR); Byung-jun Park, Suwon-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 134 days.

(21) Appl. No.: 11/699,477

(22) Filed: Jan. 30, 2007

(65) Prior Publication Data

US 2007/0194356 A1 Aug. 23, 2007

(30) Foreign Application Priority Data

Jan. 31, 2006 (KR) .................... 10-2006-0009372

(51) Int. Cl.
*H01L 31/062* (2006.01)
(52) U.S. Cl. ..................... 257/292; 257/446
(58) Field of Classification Search ............... 257/292, 257/446, 506, 510, 519
See application file for complete search history.

(56) References Cited

U.S. PATENT DOCUMENTS 7,307,327 B2 * 12/2007 Bahl et al. ............... 257/446

FOREIGN PATENT DOCUMENTS

| JP | 2005-005561 | | 1/2005 |
| KR | 1020030057707 | A | 7/2003 |
| KR | 1020030089740 | A | 11/2003 |
| KR | 1020040007971 | A | 1/2004 |
| KR | 1020050061608 | | 6/2005 |
| KR | 1020050061608 | A | 6/2005 |
| KR | 1020050082587 | A | 8/2005 |
| KR | 1020060003659 | A | 1/2006 |

\* cited by examiner

*Primary Examiner*—Mark Prenty
(74) *Attorney, Agent, or Firm*—Volentine & Whitt, PLLC

(57) ABSTRACT

An image sensor is provided. The image sensor includes a substrate; a first isolation region, a second isolation region, a plurality of photoelectric transducer devices, a read element and a floating diffusion region. The second isolation region has a depth that is less than that of the first isolation region. The plurality of photoelectric transducer devices is isolated from one another by the first isolation region. The read element and the floating diffusion region are isolated from the photoelectric transducer devices by the second isolation region.

23 Claims, 22 Drawing Sheets

IMAGE SENSOR HAVING IMPROVED SENSITIVITY AND DECREASED CROSSTALK AND METHOD OF FABRICATING SAME

BACKGROUND OF THE INVENTION

1. Field of the Invention

The present invention relates to an image sensor. More particularly, the invention relates to an image sensor having improved sensitivity and decreased crosstalk, as well as a method of fabricating such an image sensor.

This application claims priority from Korean Patent Application No. 10-2006-0009372 filed on Jan. 31, 2006, the subject matter of which is hereby incorporated by reference in its entirety.

2. Description of the Related Art

An image sensor converts optical images into electrical signals. Recent evolution in various consumer products (e.g., digital cameras, camcorders, Personal Communication Systems (PCSs), game equipment, surveillance cameras and medical micro-cameras) has resulted in a sharp increase in the demand for image sensors having improved performance characteristics.

Conventionally, Metal Oxide Semiconductor (MOS) image sensors have been used within a variety of optical imaging products and scanning schemes. MOS image sensors are advantageous because their related signal processing circuits may be integrated on a signal chip so that incorporating products may be miniaturized. MOS processing technologies are also well developed and may be used at reduced cost. Power consumption is also very low, so that the MOS image sensors may be applied to power conscious and battery powered products. Given the excellent resolution and quality performance provided by MOS image sensors, numerous emerging applications are being identified.

However, as the degree of fabrication integration increases for MOS image sensors in order to satisfy demands for finer image resolution capabilities, the size of the constituent photoelectric transducer device, (e.g., a photodiode) in each unit pixel becomes smaller. Unfortunately, reduction in the physical size of the photoelectric transducer device results in a corresponding reduction in the sensitivity of the MOS image sensor.

Furthermore, as pixel density increases in various products, the corresponding inter-pixel distance decreases. This decrease in active device separation leads to crosstalk between adjacent pixels. Inter-pixel crosstalk may be classified into optical crosstalk "A" and electrical crosstalk "B" which are conceptually illustrated in Figure (FIG.) 1.

In optical crosstalk, light incident through a micro-lens and/or a color filter (not shown) is not transmitted to an intended photodiode 4. Instead, the incident light may be transmitted to an adjacent photodiode 4. This result may occur, in part, because incident light 6a is reflected from the top and/or side surfaces of metal wires M1, M2 and M3. In may also occur because incident light 6b is refracted as it passed from the surface of a multilayer structure through inter-layer dielectric films 5a, 5b and 5c which have different refractive indices. This phenomenon is particularly prevalent where the inter-layer dielectric films have non-uniform surfaces.

In electrical crosstalk, an Electron Hole Pair (EHP) formed outside the depletion region of a photoelectric transducer device 2 by long-wavelength incident light 7 is transmitted into an adjacent photodiode 2 through diffusion.

When crosstalk occurs, the resolution is degraded in the case of a gray image sensor to the point where the resulting image is distorted. Furthermore, in the case of a color image sensor (e.g., an image sensor incorporating a Color Filter Array (CFA) of red, green and blue), crosstalk due to red (e.g., relatively long wavelength light) incident light may occur, thereby degrading the resulting image with a tint.

As shown in FIG. 1, a Shallow Trench Isolation (STI) region 3a is typically provided between adjacent photodiodes 4 in the conventional image sensor. STI region 3a may be provided in a p-type doping region 3b and is designed to reduce the possibility of electrical crosstalk. The p-type doping region 3b is formed using an ion implantation process. However, there is a limitation to the depth at which p-type doping regions 3b may be formed under STI region 3a. Thus, it is not possible to satisfactorily provide an electrical crosstalk barrier. Furthermore, the p-type doping region 3b does not provide an effective optical crosstalk barrier.

SUMMARY OF THE INVENTION

Accordingly, embodiments of the present invention have been made keeping in mind at least the above problems and such embodiments provide an image sensor having improved sensitivity and decreased crosstalk. Embodiments of the invention also provide a method of fabricating such an image sensor.

In one embodiment, the invention provides an image sensor comprising; a first isolation region formed in a substrate, a second isolation region formed with a depth less than a depth of the first isolation region, a plurality of photoelectric transducer devices isolated from one another by the first isolation region, and a read element and a floating diffusion region isolated from the photoelectric transducer devices by the second isolation region.

In another embodiment, the invention provides an image sensor comprising; a first conductive type impurity layer formed in a substrate and spaced apart from a surface of the substrate, a trench isolation region extending from the surface of the substrate to the first conductive type impurity layer, and a plurality of photoelectric transducer devices optically and electrically isolated from one another by the trench isolation region and the first conductive type impurity layer.

DESCRIPTION OF EMBODIMENTS

Figure 1:
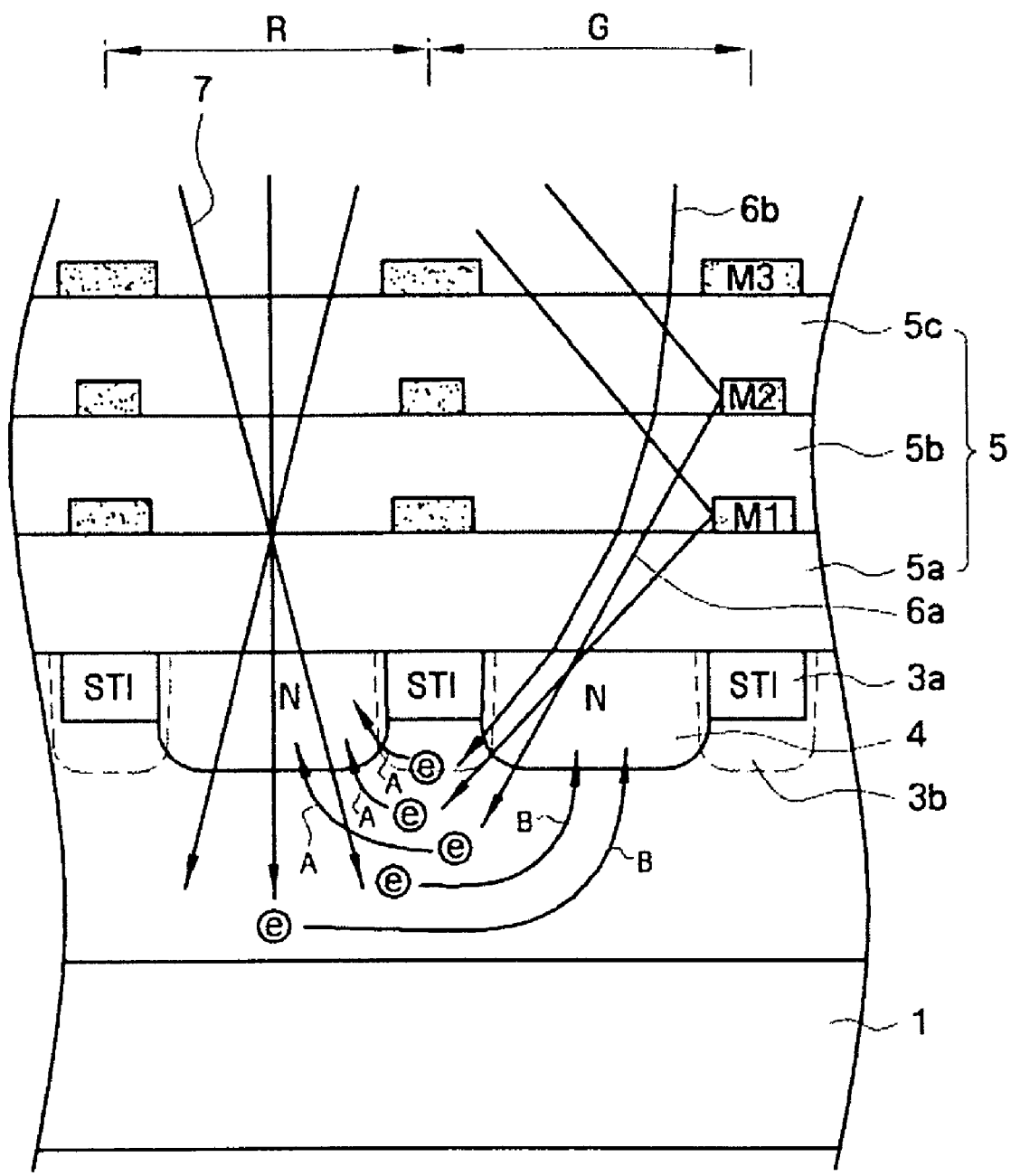
FIG. 1 is a sectional view of a conventional image sensor.

Merits and characteristics of the invention, and methods for accomplishing them will become more apparent from the following embodiments taken in conjunction with the accompanying drawings. However, the present invention is not limited to the disclosed embodiments, but may be implemented in various manners. The embodiments are provided to complete the disclosure of the present invention and to allow those having ordinary skill in the art to understand the scope of the present invention. The present invention is defined by the category of the claims. In some embodiments, well-known processes, well-known device structures and well-known technologies will not be described in detail to avoid obscuring the present invention.

The same reference numerals in different drawings denote the same or similar elements. As used herein, the term "and/or" includes any and all combinations of one or more of the associated listed items. It is emphasized that the term "comprises" or "comprising" is used in this specification to specify the presence of stated features, steps or components, but does not preclude the addition of one or more further features, steps or components, or groups thereof. Furthermore, terms in the description are used not to restrict the present invention but to describe embodiments.

CMOS Image Sensors (CISs) are disclosed as examples with reference to the accompanying drawings. The disclosed exemplary CISs include isolation regions capable of reducing electrical and optical crosstalk, and improving the sensitivity of photoelectric transducer devices.

FIGS. 3 through 10D are various views illustrating CMOS Image Sensors (CISs) according to embodiments of the present invention, in which an active pixel sensor array is constructed using a 4-shared pixel in which 4 photoelectric transducer devices share a read element, as a unit pixel. Those of ordinary skill in the art will recognize this description as merely being exemplary of many other embodiments of the invention.

The photoelectric transducer device may be a photo transistor, a photo gate, a photodiode (hereinafter referred to as a "PD"), a pinned photodiode (hereinafter referred to as a "PPD"), and/or a combination thereof. In certain embodiments of the invention, a PD or PPD is used within a CIS. In the following description, the photoelectric transducer device is referred to as a PD when it can be realized as a PD or PPD, and it is separately referred to as a PPD when only a PPD is specifically illustrated.

A unit pixel includes a floating diffusion region (hereinafter referred to as a "FD") for reading a charge from the PD, and a plurality of read elements. A read element may include a select element, a drive element and a reset element.

Since four PDs share the select element, the drive element and the reset element, a 4-shared pixel can reduce the area of the read element and then increase the size of the PD using the reduced read element area. Accordingly, it is possible to increase light reception efficiency and improve photo sensitivity and the number of saturated signals.

Figure 2:
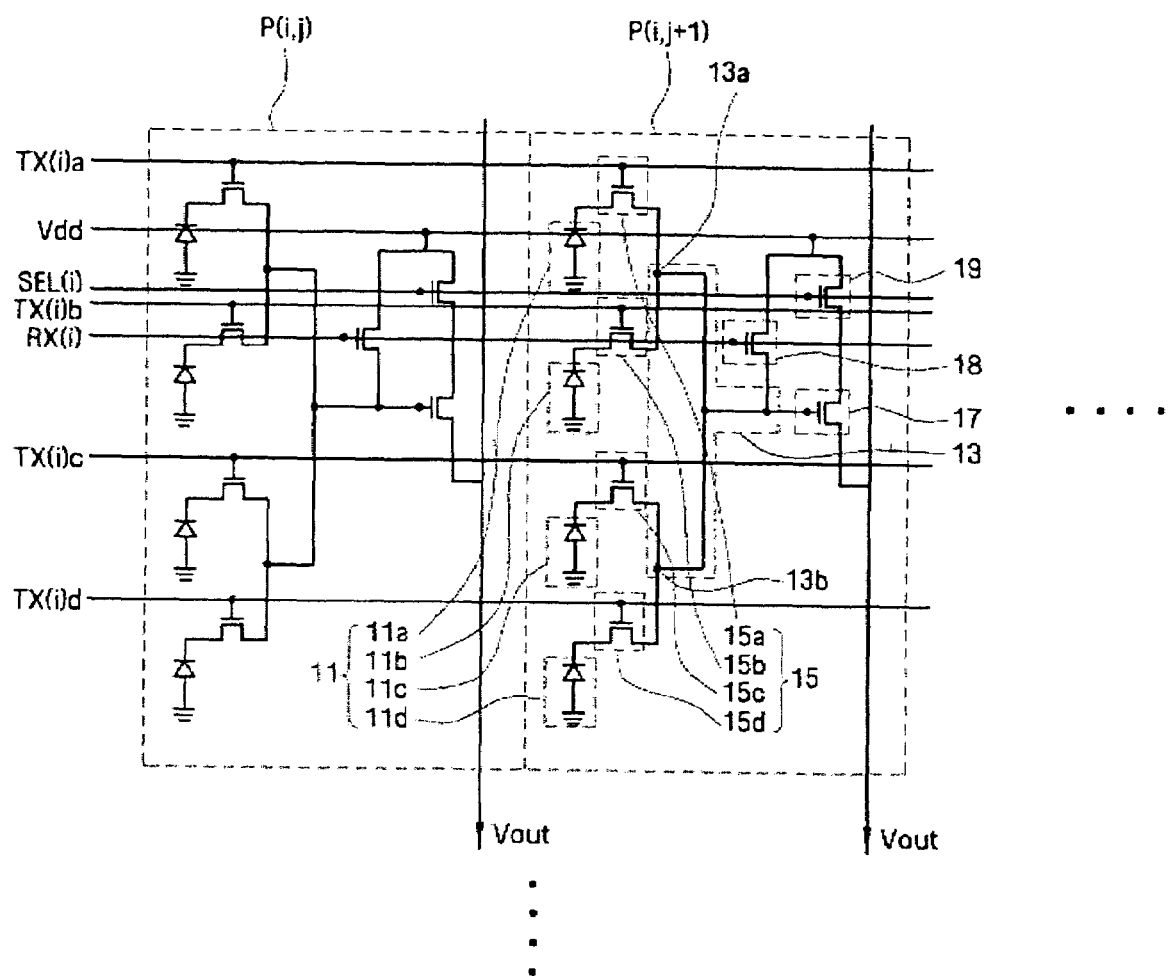
FIG. 2 is an equivalent circuit diagram of the active pixel sensor array of a 4-shared pixel image sensor according to some embodiments of the present invention.

FIG. 2 is an equivalent circuit diagram of an APS array for a 4-shared pixel image sensor according to an embodiment of the invention.

Referring to FIG. 2, a 4-shared pixel P includes four PDs 11a, 11b, 11c and 11d. The four PDs 11a, 11b, 11c and 11d receive incident light and accumulate charges corresponding to the intensity of light. The four PDs 11a, 11b, 11c and 11d are respectively coupled with charge transmission elements 15a, 15b, 15c and 15d that transmit accumulated charges to an FD 13. A floating diffusion region 13 includes a first FD 13a which is shared by two PDs 11a and 11b, and a second FD 13b which is shared by other two PDs 11c and 11d and is electrically coupled with the first FD 13a. Since the parasitic capacitance of the first FD 13a and the parasitic capacitance of the second FD 13b are serially connected, the total parasitic capacitance of the FD 13 can be minimized. Therefore the charge in FDs (13a, 13b) can be used as the driving voltage of sufficient volume of drive elements 17.

The 4-shared pixel P has four PDs 11a, 11b, 11c and 11d which share a drive element 17, a reset element 18 and a select element 19.

The drive element 17 illustrated as a source follower amplifier amplifies a change in the electrical potential of the FD 13 which has received charge accumulated in each of the PDs 11a, 11b, 11c and 11d, and outputs it to an output line Vout.

The reset element 18 periodically resets the FD 13 to a reference value. The reset element 18 may be comprised of a single MOS transistor driven by a bias provided by a reset line RX(i) which applies a desired bias. When the reset element 18 is turned on by the bias provided by the reset line RX(i), a desired electrical potential provided to the reset element 18, for example, a power voltage VDD, is transmitted to the FD 13.

The select element 19 serves to select the 4-shared pixel P to be read on a row basis. The select element 19 may be comprised of a MOS transistor driven by a bias which is provided by a row select line SEL(i). When the select element 19 is turned on by the bias provided by the row select line SEL(i), a predetermined electrical potential provided to a drain of the select element 19, for example, a power voltage VDD, is transmitted to the drain region of the drive element 17.

Transmission lines TX(i)a, TX(i)b, TX(i)c and TX(i)d which apply biases to charge transmission elements 15a, 15b, 15c and 15d, a reset line RX(i) which applies a bias to the reset element 18, and a row select line SEL(i) which applies a bias to the select element 19, can be extended and arranged substantially in the row direction and in parallel with one another.

Figure 3:
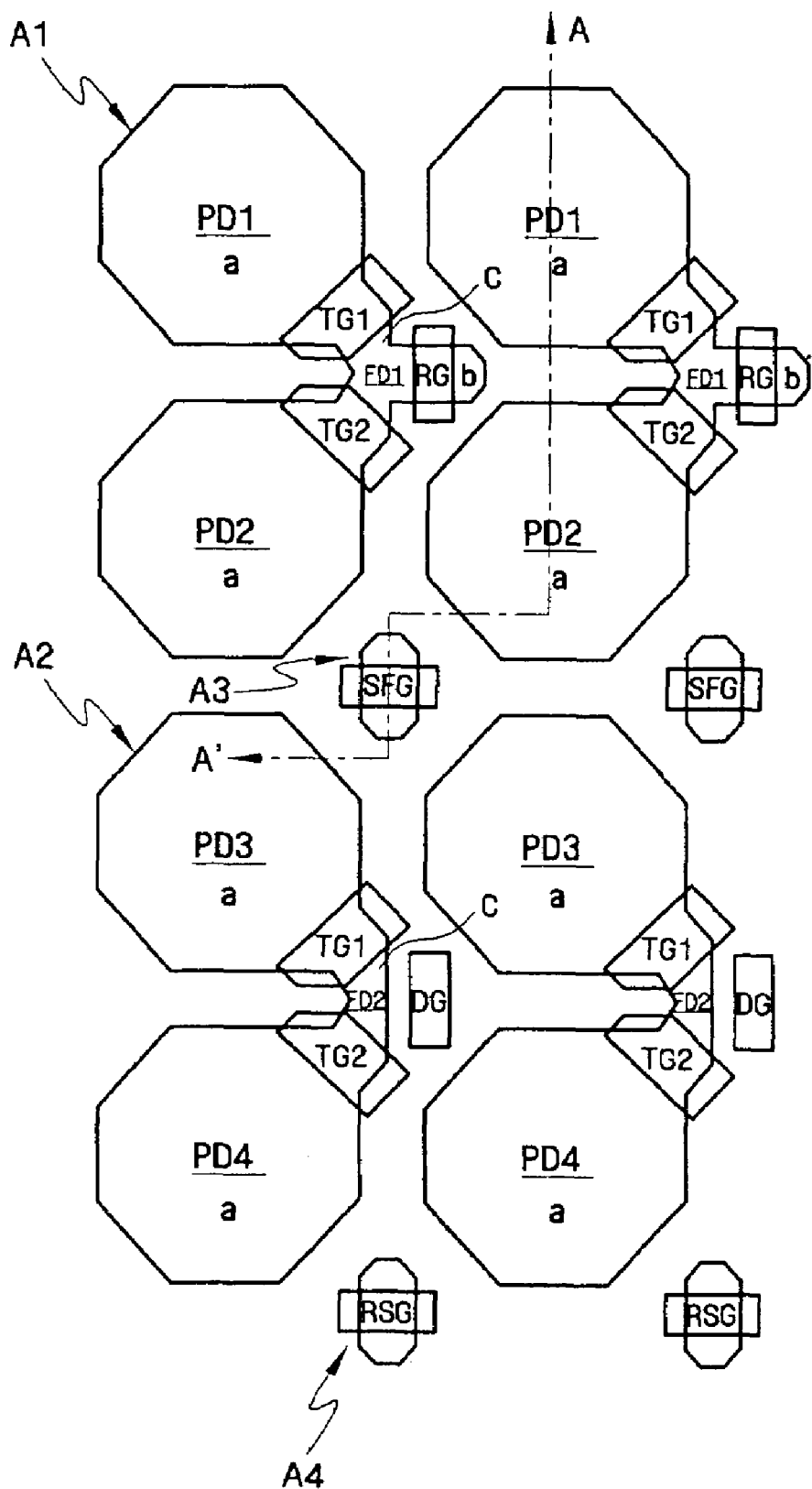
FIG. 3 is a layout of the active pixel sensor array of a 4-shared pixel image sensor according to some embodiments of the present invention.

A layout for an APS array of a 4-shared pixel CIS according to an embodiment of the invention is shown in FIG. 3.

Referring to FIG. 3, the APS array of the 4-shared pixel CIS according to an embodiment of the invention is formed in such a way that a pair of first active area A1 and second active area A2 is repeatedly arranged in a matrix. The first active area A1 includes PD1 and PD2 sharing a first FD FD1. The second active area A2 includes PD3 and PD4 sharing a second FD FD2. Each pair of first and second active areas A1 and A2 is associated with corresponding third and fourth active areas A3 and A4—independent read element active areas. That is, the first through fourth active areas A1, A2, A3 and A4 constitute one unit active area of the 4-shared pixel.

The first active area A1 is a one axis merged dual lobe type active area, and the second active area A2 is a no axis merged dual lobe type active area.

In some additional detail, for the first active area A1, a dual lobe active area "a" is merged with an axis active area "b" through a connection active area "c". The dual lobe active area "a" is symmetrical with respect to the axis active area "b" in the column direction. The dual lobe active area "a" is an active area including PD1 and PD2, and the connection active area "c" includes first FD FD1.

For the second active area A2, each dual lobe active area "a" is merged with one through a connection active area "c" without any axis. The dual lobe active area is symmetrical in the column direction. The dual lobe active area "a" is an active area including two PDs, and the connection active area "c" includes second FD FD2.

For efficient wiring, it may be advantageous to dispose a reset gate RG in an axis active area "b" so as to form a reset element. Since the reset element serves to periodically reset the floating diffusion region FD, it may be advantageous to form the junction of the floating diffusion region FD and the reset element as one from the point of view of minimized wiring. However, the element formed in the axis active area "b" is not limited to the reset element. In order to facilitate repetition of this arrangement, a dummy gate DG having substantially the same shape as the reset gate RG may be disposed in a region adjacent to the connection portion of the second active area A2.

The third and fourth active areas A3 and A4 are respectively provided with read elements. In the case where the reset element is formed in the axis active area "b", the third active area A3 may be provided with a drive element, and the fourth active area A4 may be provided with a select element. Accordingly, the third active area A3 may be provided with the source follower gate SFG of the drive element, and the fourth active area A4 may be provided with the select gates RSGs of the select element. However, depending on how the wiring is formed, the third active area A3 may be provided with the select element and the fourth active area A4 may be provided with the drive element.

Figure 4:
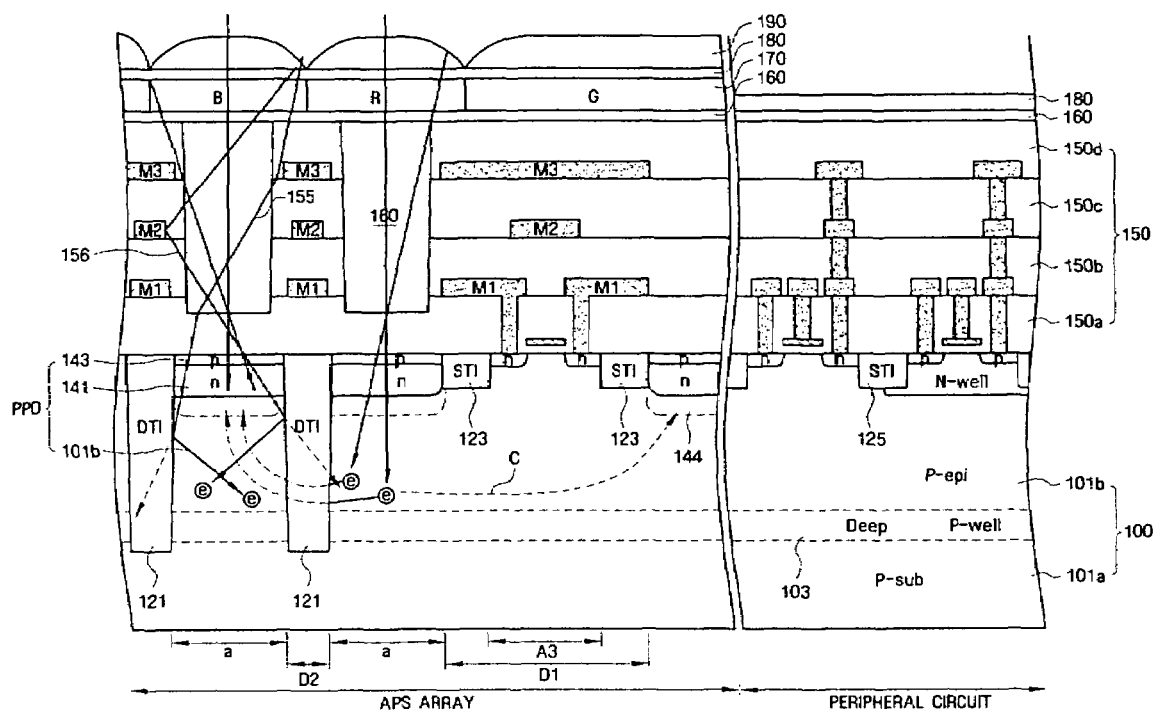
FIG. 4 is a partial sectional view of a 4-shared pixel image sensor according to an embodiment of the present invention.

FIG. 4 is a sectional view further illustrating an embodiment of a 4-shared pixel CIS formed according to the circuit diagram and the layout respectively shown in FIGS. 2 and 3.

Referring to FIG. 4, the CIS includes two different isolation regions 121 and 123 in an APS array.

A first isolation region 121 is an element isolation region which isolates PDs from each other. The first isolation region 121 is an electrical and optical crosstalk barrier as well as an element isolation region. The second isolation region 123 is an element isolation region which isolates the PD and the read element from each other.

In the case of using the layout of FIG. 3, the first isolation region 121 may be formed between the row and column parallel lines of adjacent PD active areas "a". The PD or PPD comprised an n-type doping region may be formed in the PD active area.

FIG. 4 illustrates a PPD comprising a first conductive type doping region, for example, a p-type doping region 143, and a second conductive type doping region, for example, an n-type doping region 141, under the first conductive type doping region and a p-type epitaxial layer 101b. The PPD is generally realized in an APS array design due to performance advantages related to reduction of dark current noise.

Since the absorption wavelengths corresponding to blue, green and red light in substrate 100 are 0-0.4 µm, 0.15-1.5 µm, and 0.4-5 µm, respectively, the PPD should be more than 2 µm in depth. Furthermore, in order to improve sensitivity by capturing most of the absorbed red light, it is preferable in certain embodiments of the invention that the PPD have a depth up to 5 µm, if possible.

Generally, when the n-type doping region 141 is formed by ion-implantation of n-type impurities into the p-type epitaxial layer 101b the ion concentration of which may range from $10^{13}$ to $10^{17}/cm^3$, in a dose of $10^{11}$ to $10^{12}$ ions/cm² and in an Rp (Projection Range) of about 2000 Å, a depletion layer 144 is formed in the substrate at a depth more than about 2 µm from the surface of the substrate.

The first isolation region 121 may sufficiently serve as an electrical crosstalk barrier only when the first isolation region 121 is formed deeper than the depletion layer 144 formed by the n-type doping region 141. In other words, when the first isolation region 121, which is an electrically insulating material, encloses the depletion region 144 of the PPD and the P-type epitaxial layer 101b, an EHP generated under the depletion region 144 of the PPD thermally diffuses and prevents electrical crosstalk which can affect an adjacent PPD. Furthermore, as the first isolation region 121 becomes deeper than the PPD, its function as an electrical crosstalk barrier may be more readily achieved. Accordingly, it is preferable in certain embodiments of the invention that the first isolation region 121 be formed deeper than the n-type doping region 141 by, for example, 2 µm or more. In the case where the PPD is formed up to 5 µm in depth by controlling the formation dose and Rp of n-type doping region 141 in order to improve the sensitivity of the PPD, it is apparent that the first isolation region 121 also should be formed deeper than 5 µm. Such a depth relationship can be applied to the PD which is comprised only an n-type doping region 141, as well as the PPD, in the same manner.

Further, in the case where the first isolation region 121 comes into contact with a p-type deep well 103, an electrical crosstalk barrier may be effectively implemented. The p-type deep well 103 is a first conductive type (p-type) impurity layer spaced apart from the surface of the substrate 100 and formed inside the substrate 100, in more detail (e.g.,), in the p-type epitaxial layer 101b. The p-type deep well 103 is an electrical crosstalk barrier which forms a potential barrier to prevent the EHP generated in the substrate 101a or the p-type epitaxial layer 101b from thermally diffusing into the PPD, and decreases electrical crosstalk occurring due to random drift of electrons by increasing the recombination of electrons and holes. Accordingly, when the bottom of the first isolation region 121 is in contact with the p-type deep well 103, it is possible to form a minimum closed electrical crosstalk barrier. When the bottom of the first isolation region 121 is formed deeper than that of the p-type deep well 103, that is, the sidewalls of the first isolation region 121 are in contact with the p-type deep well 103, a more reliable electrical crosstalk barrier can be formed.

As described above, according to embodiments of the present invention, since the position at which the p-type deep well 103 is formed can be controlled depending on the depth of the first isolation region 121, it is possible to sufficiently increase the sensitivity of the PPD by maximizing the size (e.g.,) volume of the PPD. When it is desired to increase the sensitivity of the PPD, the depth of the first isolation region 121 may be more than 2 μm, and approximately 5 μm. If this process approach is implemented, the size of the PPD may be maximized by increasing the depth of the first isolation region 121 to greater than 5 μm and forming the p-type deep well 103 contacting the first isolation region 121, so that the sensitivity of the PPD may be maximized.

Meanwhile, in the case where the trench 109 is filled with a material having a refractive index which is lower than that of the substrate 101, (e.g., a silicon oxide film, a silicon nitride film, or air), the first isolation region 121 may also function as an optical crosstalk barrier.

With reference to FIG. 4, most of the refracted light 155 is formed when incident light is refracted by the (potentially non-uniform) surface(s) found in the multilayer structure formed by dielectric films 150a, 150b, 150c and 150d, each potentially having a different refractive index. The reflected light 156 is formed when incident light is reflected from the upper and/or side surfaces of the metal wiring M1, M2 and M3, as well as the light reflected by the interface between the substrate 100 and the first isolation region 121. These two components, refracted light 155 and/or reflected light 156, account for most of the optical crosstalk potentially interfering with operation of an adjacent PPD.

FIG. 4 illustrates an embodiment where the substrate 100 is formed from a p-type bulk substrate 101a and a p-type epitaxial layer 101b having a thickness ranging from about from 2 to 10 μm. Each of these materials responds similarly to optical wavelengths in the infrared or near infrared bands. In one more specific embodiment, the p-type epitaxial layer 101b is formed to a thickness ranging from about 3 to 5 μm. Where a p-type epitaxial layer 101b is used, an effective potential barrier may be formed by controlling its doping concentration in relation to the p-type deep well 103, thereby improving overall electron accumulation capabilities. Accordingly, where the p-type epitaxial layer 101b is used, an n-type bulk substrate may alternately be used as the bulk substrate 101a.

Indeed, the substrate 100 may be variously formed from a variety of combinations, such as those listed below in Table 1.

TABLE 1

| Bulk\substrate | P-type deep well | Epitaxial layer |
|---|---|---|
| p-type | X | X |
| p-type | O | X |
| p-type | X | p-type |
| p-type | O | p-type |
| n-type | X | X |
| n-type | O | X |
| n-type | X | p-type |
| n-type | X | n-type |
| n-type | O | p-type |
| n-type | O | n-type |
| n-type | O | X ** |

The particular case ** indicated above, instead of an epitaxial layer, a p-type well may be formed in an n-type bulk substrate. Further, a substrate formed from an organic plastic substrate may be used instead of the semiconductor substrate variations illustrated in Table 1.

FIGS. 5A to 5D are sectional views illustrating the various exemplary embodiments of the first isolation region 121 (deep trench isolation region) shown in FIG. 4.

Figure 5A:
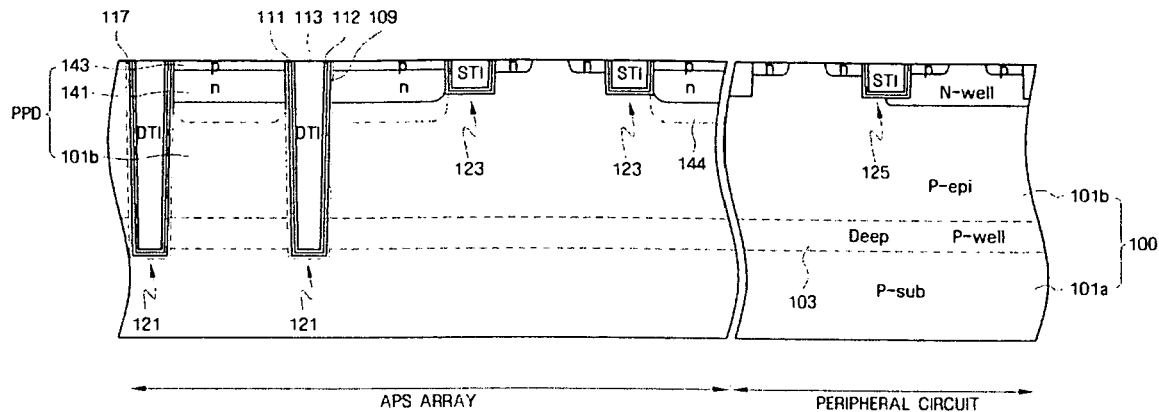
FIGS. 5A to 5D are sectional views illustrating the various shapes of a first isolation region (deep trench isolation region) shown in FIG. 4.

FIG. 5A illustrates an embodiment where the first isolation region 121 comprises a trench isolation region formed by the sequentially deposition of a thermal oxide film 111 and a silicon nitride film liner 112 on the bottom and sidewall surfaces of a trench 109. The trench 109 is then filled with a filler material 113, such as an oxide film.

Figure 5B:
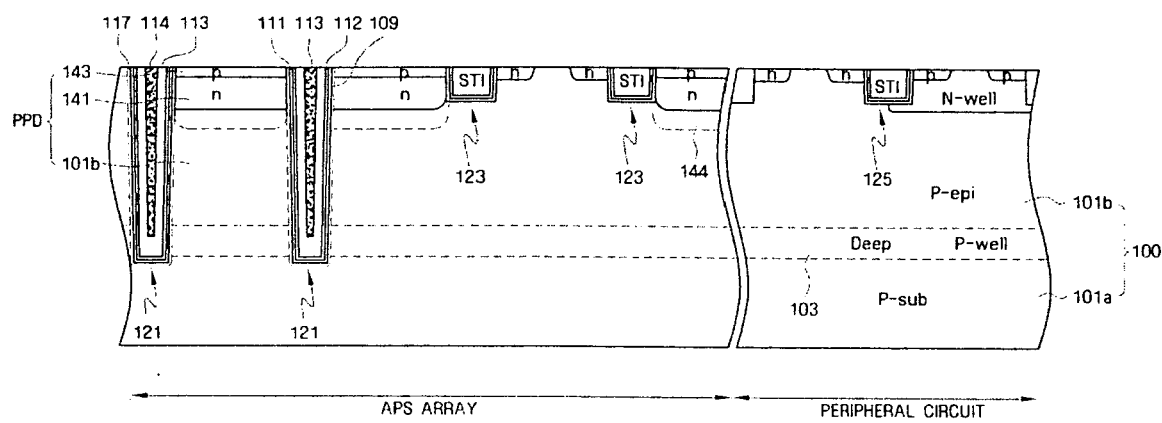

FIG. 5B illustrates an embodiment where the first isolation region 121 comprises a trench isolation region formed by forming thermal oxide layer 111 on the bottom and sidewalls of trench 109, forming silicon nitride liner 112 on thermal oxide film 111, partially filling the trench 109 with silicon oxide film 113, and then filling the remaining portion of the trench 109 with an un-doped poly-silicon 114 having good gap-filling properties.

Figure 5C:
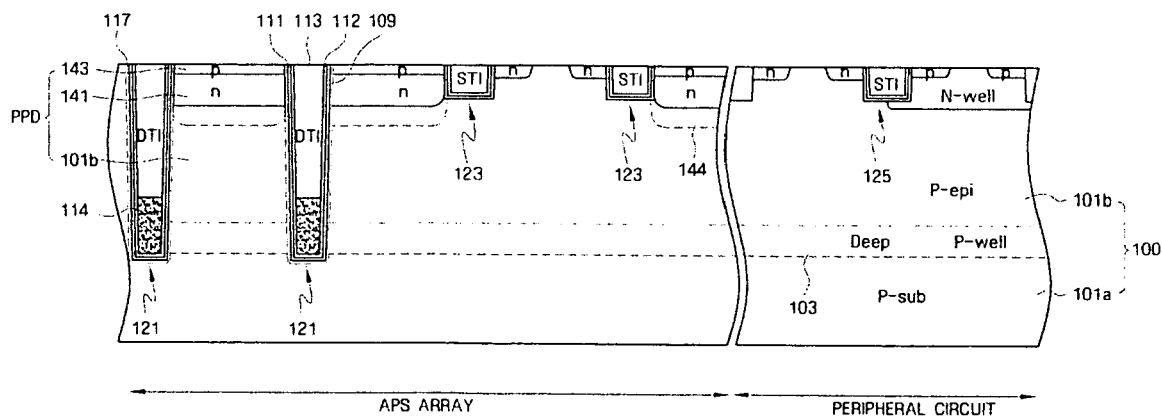

FIG. 5C illustrates an embodiment where the first isolation region 121 comprises a trench isolation region formed by filling a lower portion of the trench 109 with un-doped poly silicon 114 having a good gap-filling property, and then filling an upper portion of the trench 109 with oxide film 113 or the like.

Figure 5D:
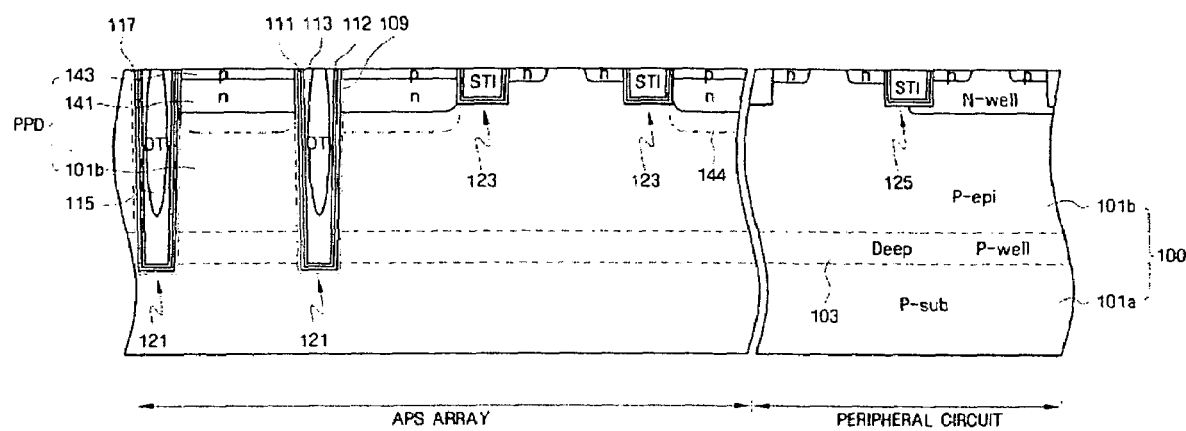

FIG. 5D illustrates an embodiment where the first isolation region 121 comprises a trench isolation region having an interior portion partially filled with air 115.

Furthermore, as illustrated in FIGS. 5A and 5B, a p-type shallow doping region 117 may be formed around the first isolation region 121 to inhibit dark current from flowing to the surface portions of the trench 109 where dangling bonds or similar atomic discontinuities may be exposed during the etching process used to form the trench 109.

Referring again to FIG. 4, the APS array 9 of the CIS according to embodiments of the invention may further comprise a second isolation region 123 formed more shallowly than the first isolation region 121. The second isolation region 123 may be a STI region isolating the PD from the read element. Accordingly, the second isolation region 123 may be formed in the active area "a", the read element active areas "b", A3 and A4, and/or the floating diffusion region active area "c". As illustrated in the layout diagram of FIG. 3, the gap between the PD active area "a" and the read element active areas ("b", "c", A3 and A4) is smaller than that between the PD active area "a" and the PD active area "a". Accordingly, it may be difficult to form an isolation region in the form of a deep trench between these structures similar to the first isolation region 121. The read element active areas "b", A3 and A4 and the floating diffusion region active area "c" may fall, and the spacing distance D1 between the PD active area "a" and the PD active area "a" facing each other with respect to the read element active areas "b", A3 and A4 and the floating diffusion region active area "c" is larger than the spacing distance D2 between the PD active area "a" and the PD active area "a", facing each other directly, therefore the crosstalk path "C" through this portion may be negligible.

Accordingly, the PD active area "a", the read element active areas "b", A3 and A4 and the floating diffusion region active area "c" may be isolated by the second isolation region 123 which is shallower than the first isolation region 121. Further, as illustrated in the layout diagram of FIG. 3, a portion of the second isolation region 123 isolates the read element active areas A3 and A4 in a first pixel from the PD active area "a" in the first pixel, and the remaining portion of the second isolation region 123 isolates the read element active area "b" and the floating diffusion region active area "c" in the first pixel from the PD active area "a" in the second pixel subsequent to the first pixel.

The second isolation region 123 may be formed by filling the inside of the trench 110 with a material having a refractive index lower than that of the substrate 101, (e.g., a silicon oxide film, a silicon nitride film, a poly-silicon, or air), as in the first isolation region 121 illustrated in FIGS. 5A through 5D.

Further, the second isolation region 123 may be implemented as a STI region similar to that of the third isolation region 125 defining the active area on which the circuit elements of a peripheral circuit are formed. In certain embodiments, the second and third isolation regions 123 and 125 may be formed to a depth ranging from between about 2000 to 4000 Å.

In FIG. 4, reference numeral 160 denotes a silicon oxide film and/or transparent resin used to fill various light transmission portions of the structure. References numerals 170, 180 and 190 respectively denote a flattening layer, a color filter, and a micro-lens. In the drawing, although wiring layers M1, M2 and M3 are shown as three layers, they may be comprised two layers depending on the actual design of the CIS.

Given that a read element may be formed integral to the APS array, corresponding CMOS elements (e.g., resistors and capacitors) may be simultaneously formed in the peripheral circuit portion of the device. Since these elements can be embodied in a variety of forms well known to those skilled in the art, these elements will not be individually described.

Figure 6A:
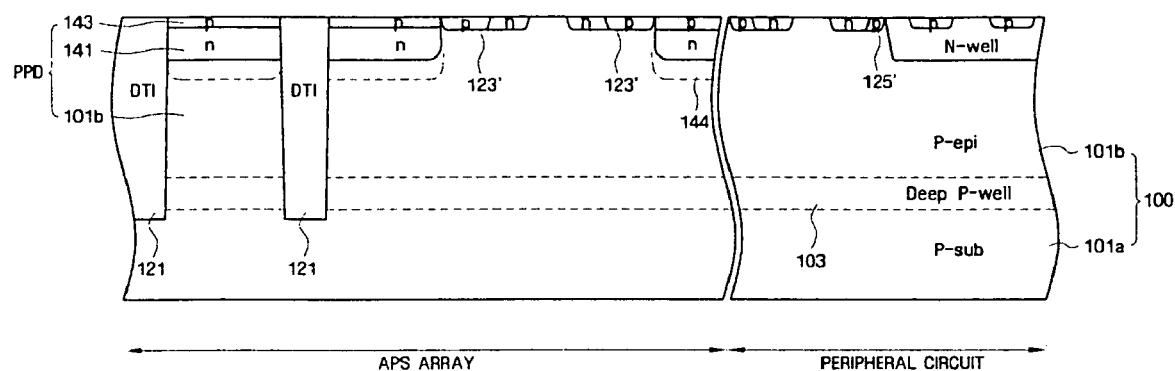
FIGS. 6A to 6B are sectional views illustrating the various shapes of a second isolation region (shallow trench isolation region) shown in FIG. 4.
Figure 6B:
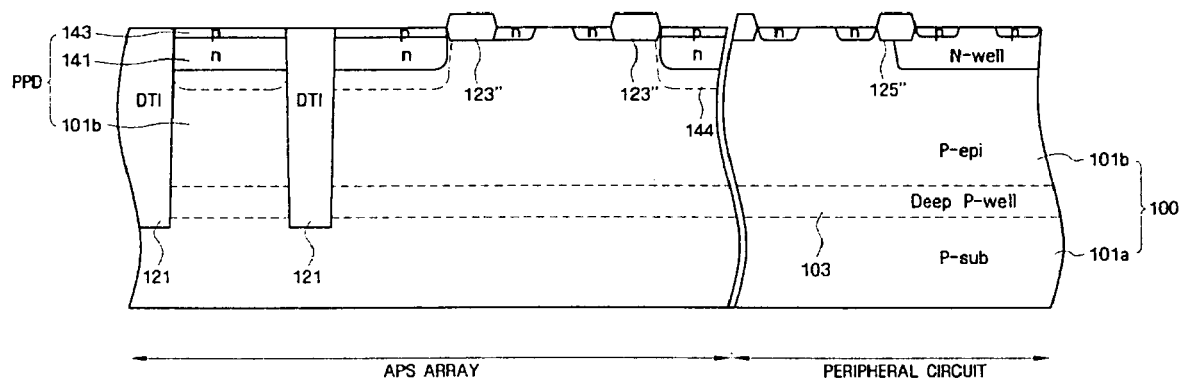

FIGS. 6A and 6B are sectional views illustrating additional embodiments of the second isolation region 123 shown in FIG. 4. The upper structure of the substrate 100 is omitted in FIGS. 6A and 6B for simplicity of illustration.

FIG. 6A illustrates an embodiment where the second isolation region is formed from a p-type doping region 123'. FIG. 6B illustrates an embodiment where the second isolation region is formed from a Field Oxide (FOX) structure 123" using a LOCOS method. In these embodiments, various isolation region(s) in the peripheral circuit region may also be formed from the p-type doping region 125', or FOX structure 123" together with the second isolation region.

Figure 7:
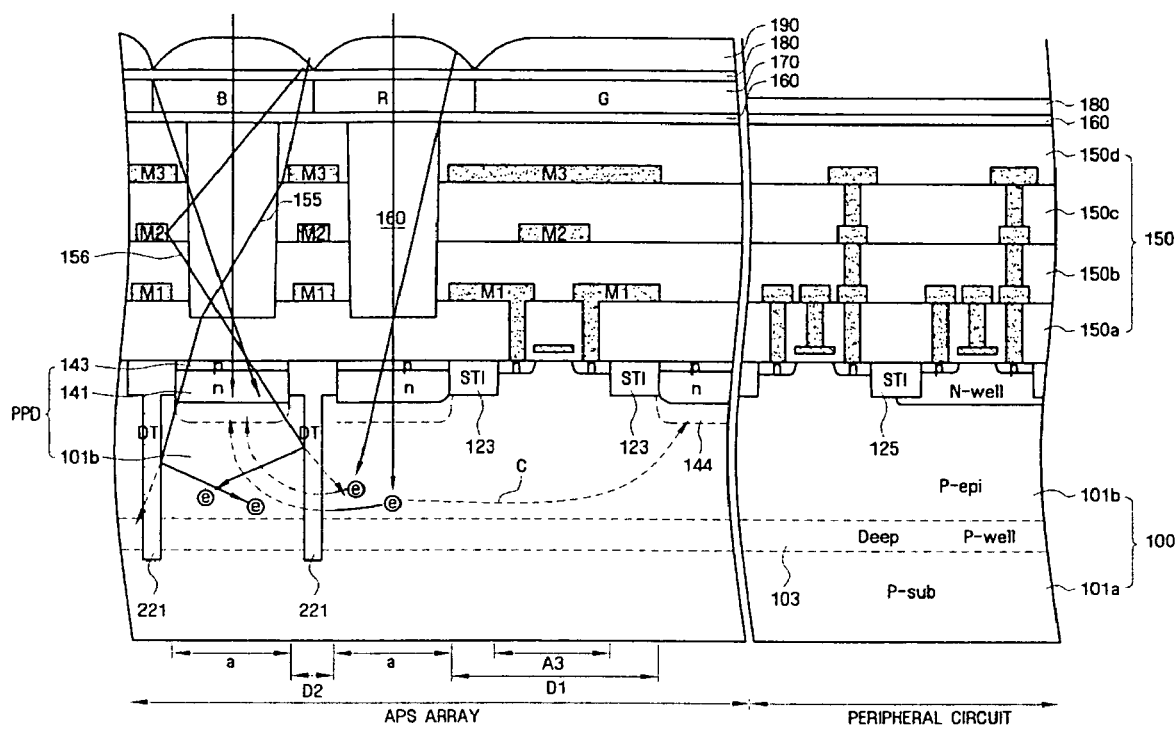
FIG. 7 is a sectional view of a 4-shared pixel image sensor according to another embodiment of the present invention.
Figure 8:
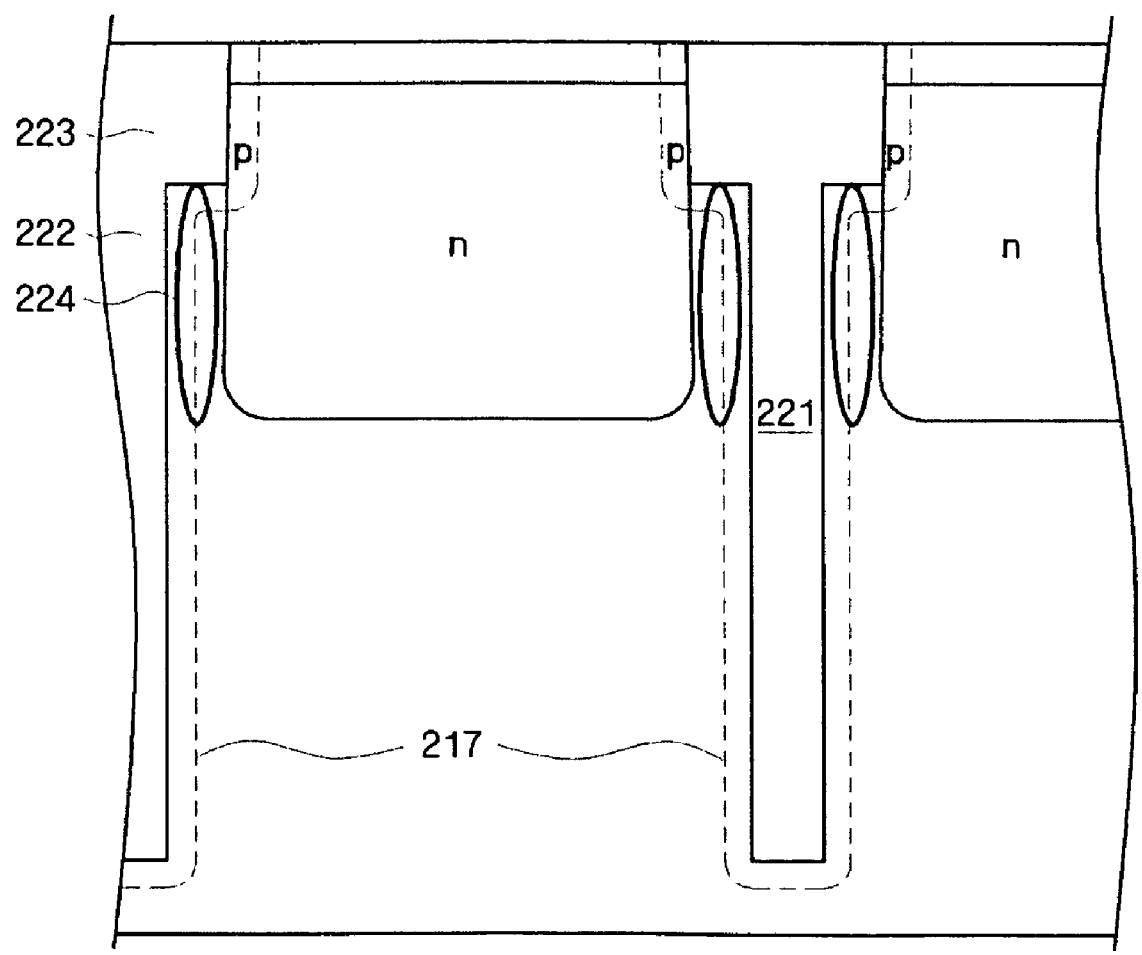
FIG. 8 is an enlarged sectional view of a first isolation region shown in FIG. 7.

FIG. 7 is a sectional view of a 4-shared pixel image sensor according to another embodiment of the present invention. FIG. 8 is an enlarged sectional view of the first isolation region 221 shown in FIG. 7.

Referring to FIGS. 7 and 8, a first isolation region 221 is different from the first isolation region 121 shown in FIG. 4 in that the former is formed of a lower trench isolation region 222 and an upper wide isolation region 223. The upper wide isolation region 223 can be embodied as a shallow trench isolation region. The upper wide isolation region 223 is connected to the top of the lower trench isolation region 222 and widens outside the sidewall of the lower trench isolation region 222. With the upper wide isolation region 223 is placed on the lower trench isolation region 222, a buffer region 224 is formed under an eave portion (i.e., the outwardly extending portion of upper wide isolation region 223) of the upper wide isolation region 223.

Referring to FIG. 8, the buffer region 224 is formed to effectively prevent the p-type shallow doping region 217, which was formed to inhibit dark current flowing to the surface of the trench 209, from reducing the effective area of the n-type doping region 141 of a PPD and thus the sensitivity of the PPD. As illustrated in FIG. 8, when the width of the upper wide isolation region 223 is formed substantially the same as that of the first isolation region 121 illustrated in FIG. 4, the width of the lower isolation region 222 is formed smaller than the first isolation region 121 illustrated in FIG. 4, and a p-type shallow doping region 217 having the same width as that of FIG. 4 is formed, it is possible to increase the size of the n-type doping region 141 by the size of the buffer region 224, compared to the CIS using the first isolation region 121.

A description of remaining elements will be omitted since they are substantially the same elements as those described in the embodiment of FIG. 4.

Figure 9A:
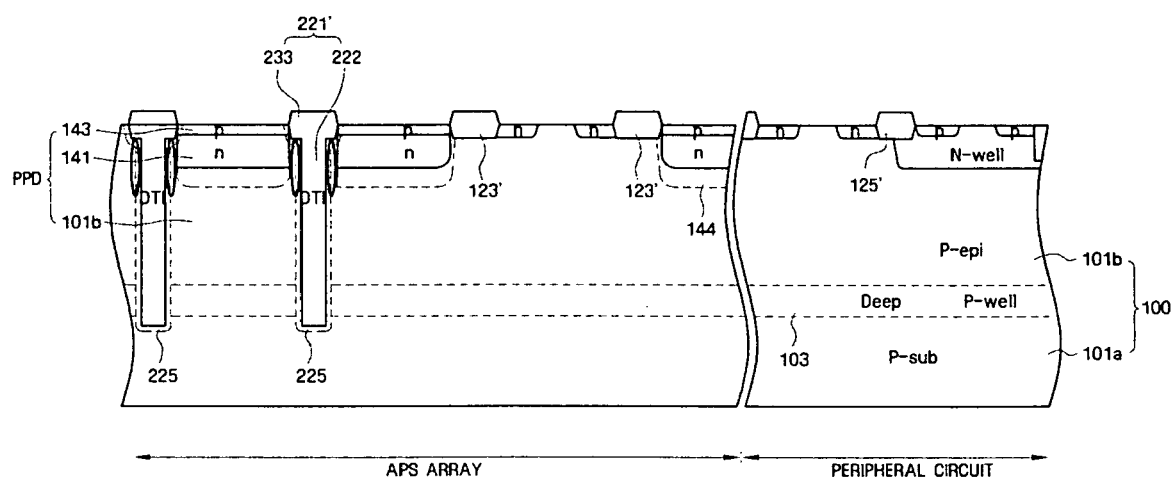
FIGS. 9A to 9C are sectional views illustrating the various shapes of a first isolation region shown in FIG. 7.
Figure 9B:
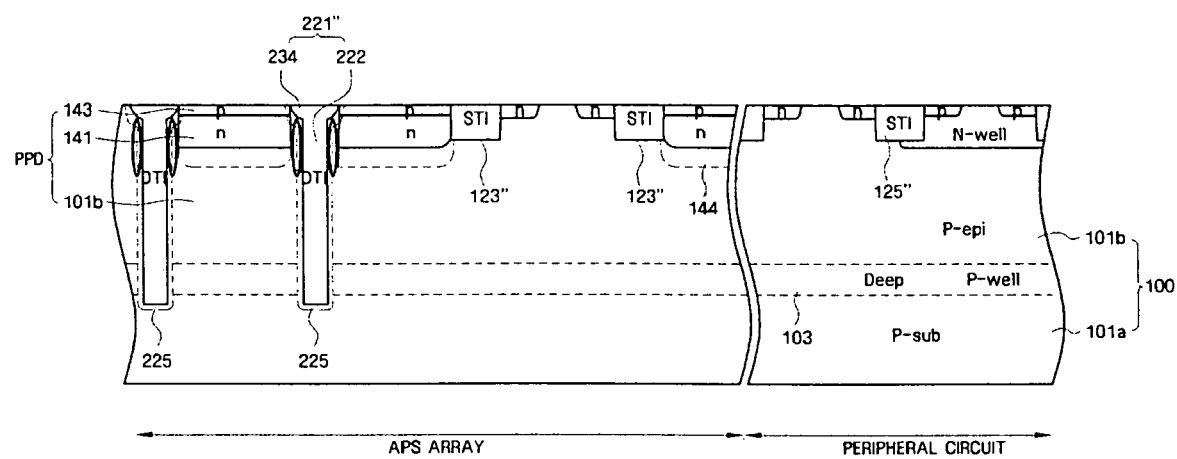
Figure 9C:
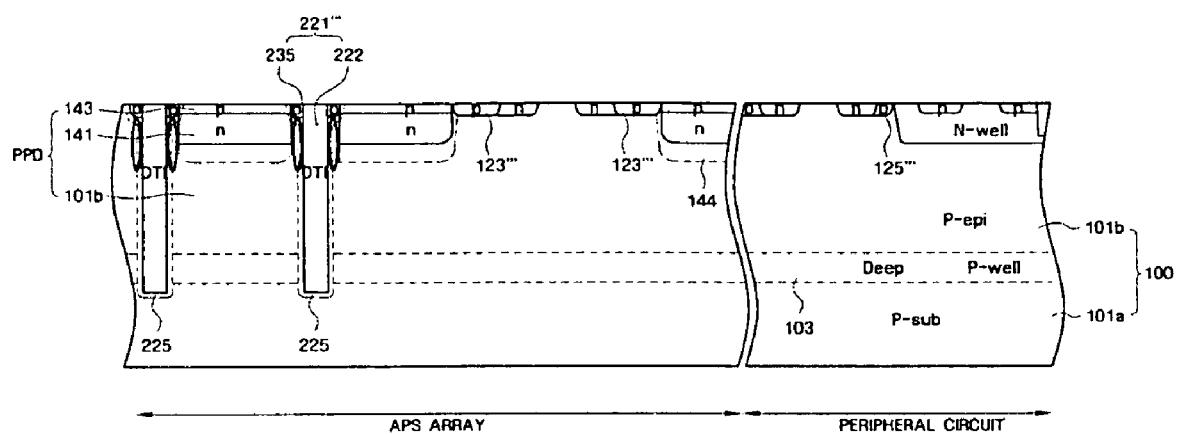

FIGS. 9A to 9C are sectional views illustrating additional embodiments of the first isolation region 221 of the 4-shared pixel image sensor illustrated in FIG. 7.

FIG. 9A illustrates an embodiment where a LOCOS region 233 instead of an upper trench isolation region is formed on a lower trench isolation region 222 so as to provide a buffer region 224. FIG. 9B illustrates an embodiment where an expansion portion 234, which is the lower trench isolation region 222 having an expanded opening formed through a wet etching or cleaning process, provides a buffer region 224, and FIG. 9C illustrates the case where a p-type junction 235 is formed on the upper portion of a sidewall of the lower trench isolation region 222 so as to provide the buffer region 224. Also in the embodiments illustrated in FIGS. 7 through 9C, it is possible to replace the second isolation region 123 with the p-type doping region or the FOX based on the LOCOS method, as shown in FIGS. 6A and 6B.

Figure 10A:
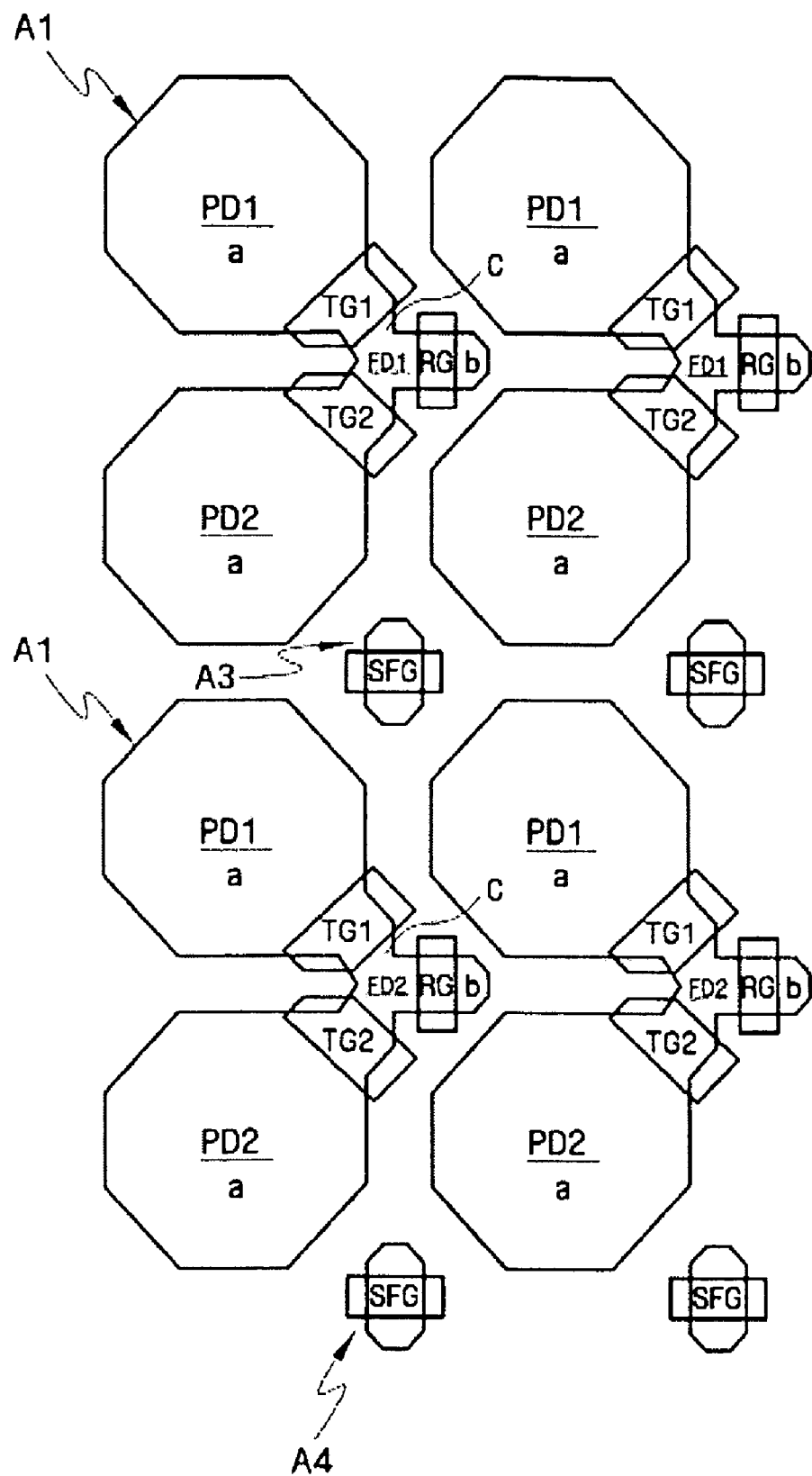
FIGS. 10A to 10C are alternative layouts of FIG. 3.
Figure 10B:
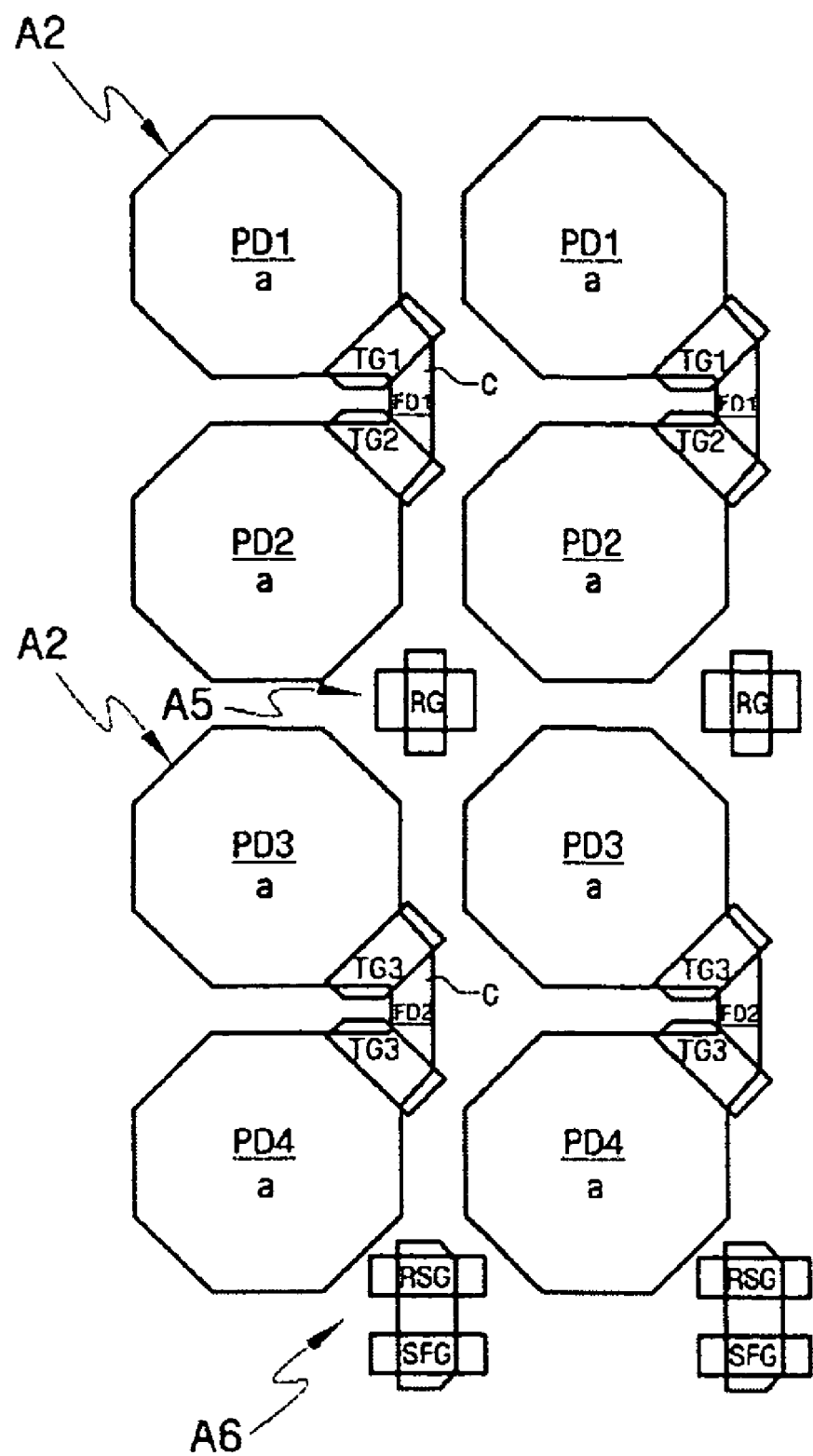
Figure 10C:
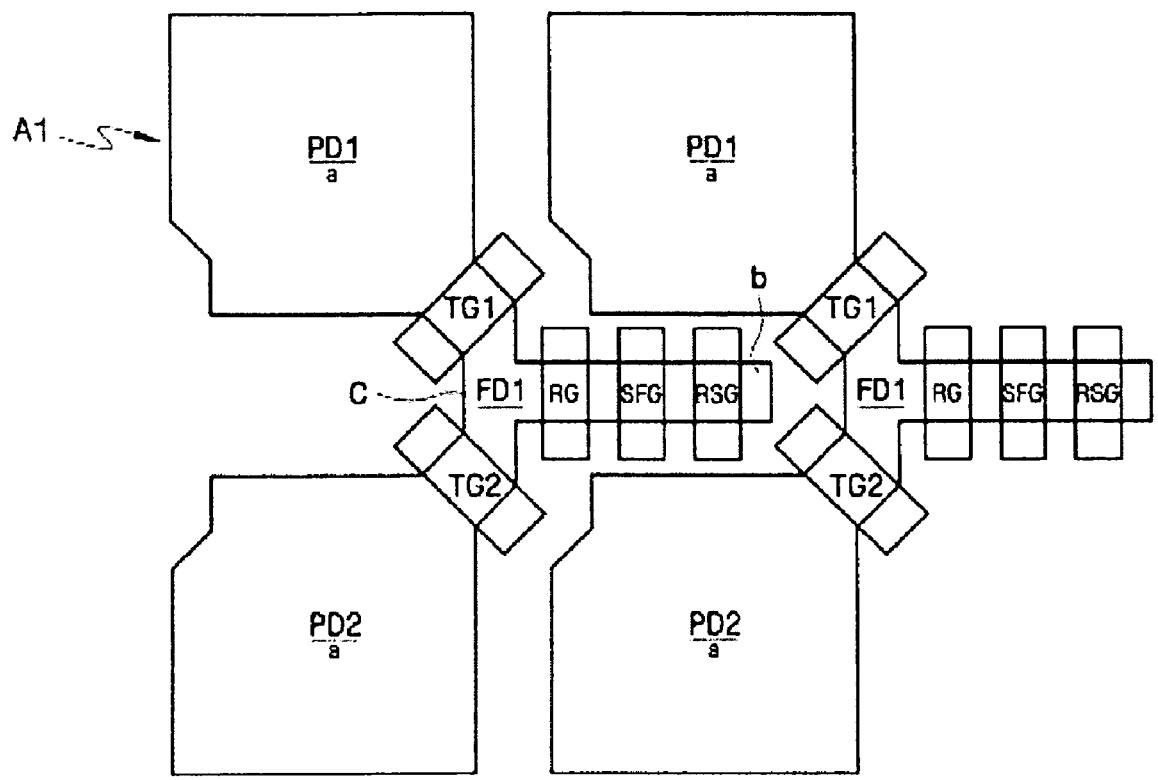
Figure 10C:
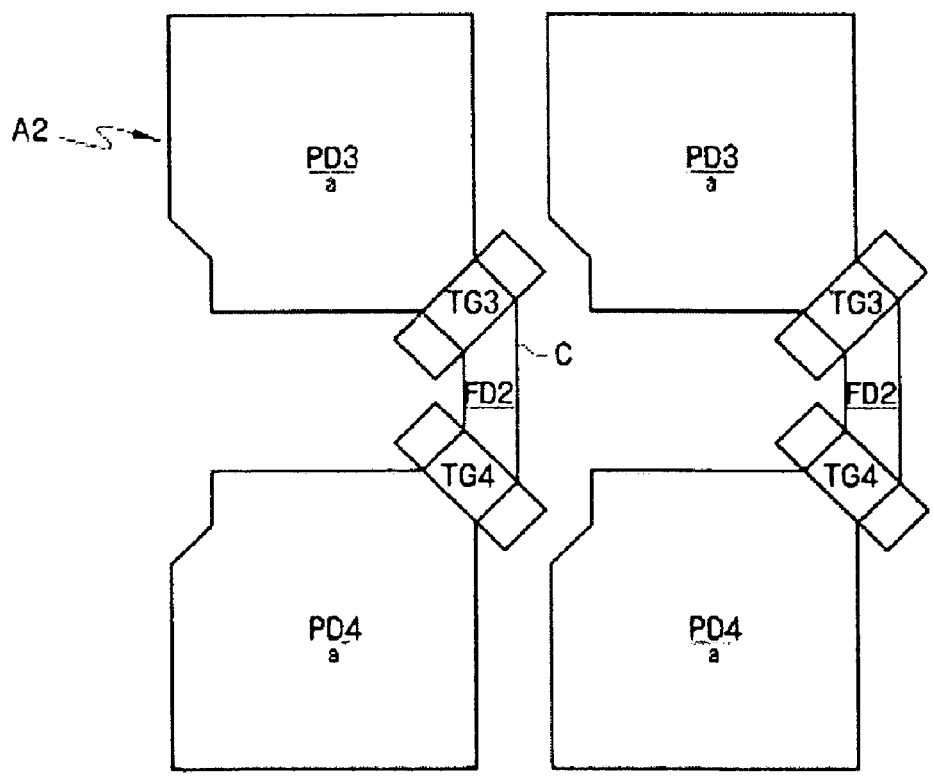

FIGS. 10A to 10C are alternate layout diagrams to that of FIG. 4.

In the layout illustrated in FIG. 10A, both of a first active area A1 having two PDs PD1 and PD2 which share a first FD FD1 and a second active area A2 having two PDs PD3 and PD4 which share a second FD FD2, are one axis merged dual lobe type active areas, unlike the layout illustrated in FIG. 3.

In an embodiment where the second active area A2 is formed of a one axis merged dual lobe type active area, it is possible to embody an MOS capacitor using a dummy gate DG on an axis active area b extended from a connection active area "c" in which the second FD(FD2) is formed.

A more detailed description of this alternative may be found, for example, in commonly assigned Korean Patent Application No. 10-2006-0004116, the subject matter of which is hereby incorporated by reference.

In the layout illustrated in FIG. 10B, four PDs PD1, PD2, PD3 and PD4 are formed on a pair of two axis merged dual lobe type active areas A2, unlike the layout illustrated in FIG. 3. Accordingly, since three read elements may be separately formed on two independent read element active areas A5 and A6, there is a difference in that two read elements must be formed on either one of the two independent read element active areas A5 and A6, for example, A6.

A reset element may be formed in the first independent read element active area A5, and a select element and a drive element formed therein may be formed in a second independent read element active area A6. Accordingly, a reset element gate RG may be placed in the first independent read element active area A5, and a select element gate RSG and a drive element gate SFG may be placed in the second independent read element active area A6.

Those of ordinary skill in the art will recognize that the type of element formed in each of the first and second independent read element active areas A5 and A6 may be varied by changing the type of wiring communicating electrical signals to the element formed in each of the active areas A5 and A6.

In the layout illustrated in FIG. 10C, all of the reset element, the drive element and the select element are formed on the axis active area "b" of the first active area A1, that is, a one axis merged dual lobe type active area, without independent read element active areas A3 and A4, unlike the layout illustrated in FIG. 4.

Also in the embodiments of a CIS using the 4-shared pixel layout illustrated in FIGS. 10A to 10C, respective active areas are defined by the first and second isolation regions having various shapes illustrated in FIGS. 4 through 9C. In detail, a first isolation region is formed between the PD active area "a" and the PD active area, facing each other without any read element active area therebetween, and a second isolation region is formed among the PD active area "a", the read element active areas "b", A3, A4, A5, A6, A7, A8 and A9 and the floating diffusion region active area "c". Further, part of the second isolation region isolates the read element active area "b" and the floating diffusion region active area "c" in the first pixel from a PD active area "a" in a second pixel subsequent to the first pixel.

Figure 11:
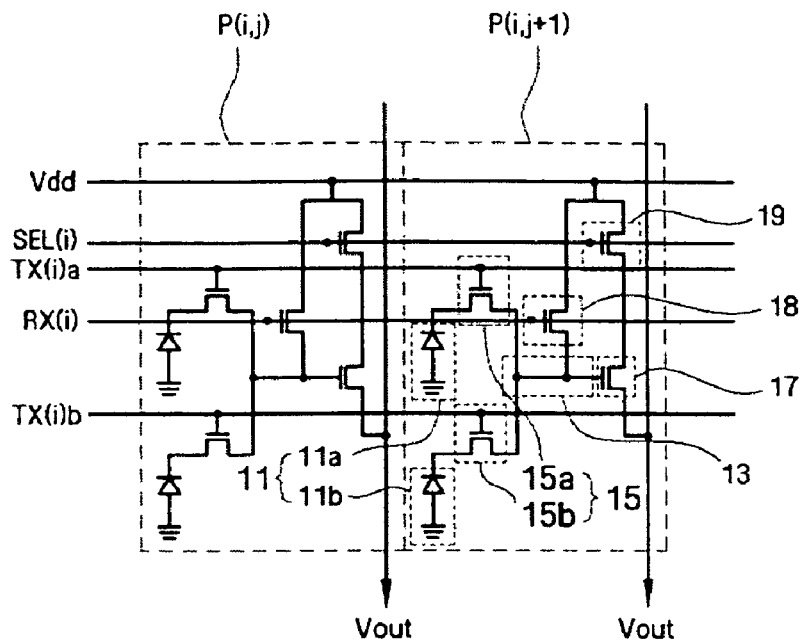
FIG. 11 is an equivalent circuit diagram of the active pixel sensor array of a 2-shared pixel image sensor according to some embodiments of the present invention.

FIG. 11 is an equivalent circuit of the APS array of a 2-shared pixel image sensor according to embodiments of the present invention.

Referring to FIG. 11, 2-shared pixels P are arranged in a matrix, thus forming the APS array. In each of the 2-shared pixels P, two PDs adjacent to each other in the column direction share the same read element.

In some additional detail, each of the 2-shared pixels P includes two PDs 11a and 11b adjacent to each other in the column direction and the two PDs 11a and 11b share a drive element 17, a reset element 18, and a select element 19. A charge accumulated in each of PDs 11a and 11b is transmitted to a common FD 13 by each of the charge transmission elements 15a and 15b.

Figure 12A:
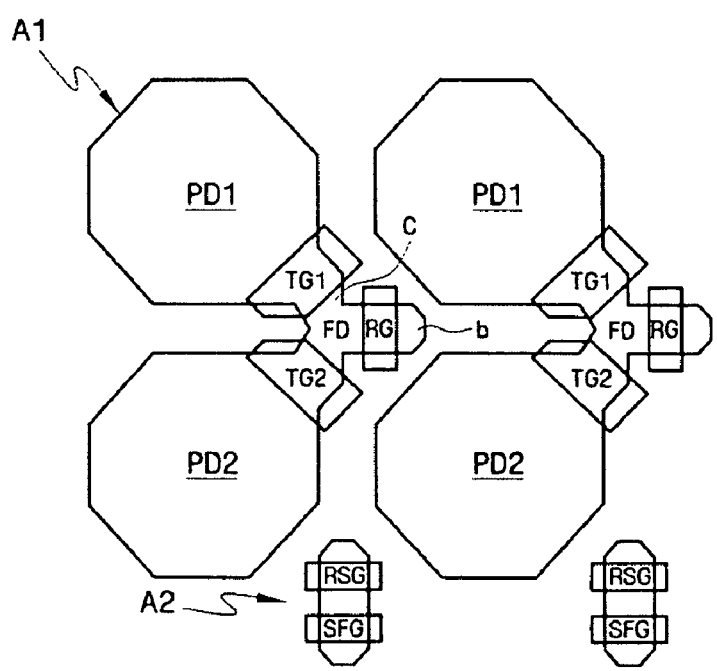
FIGS. 12A to 12B are layouts of a 2-shared pixel image sensor according to the present invention.
Figure 12B:
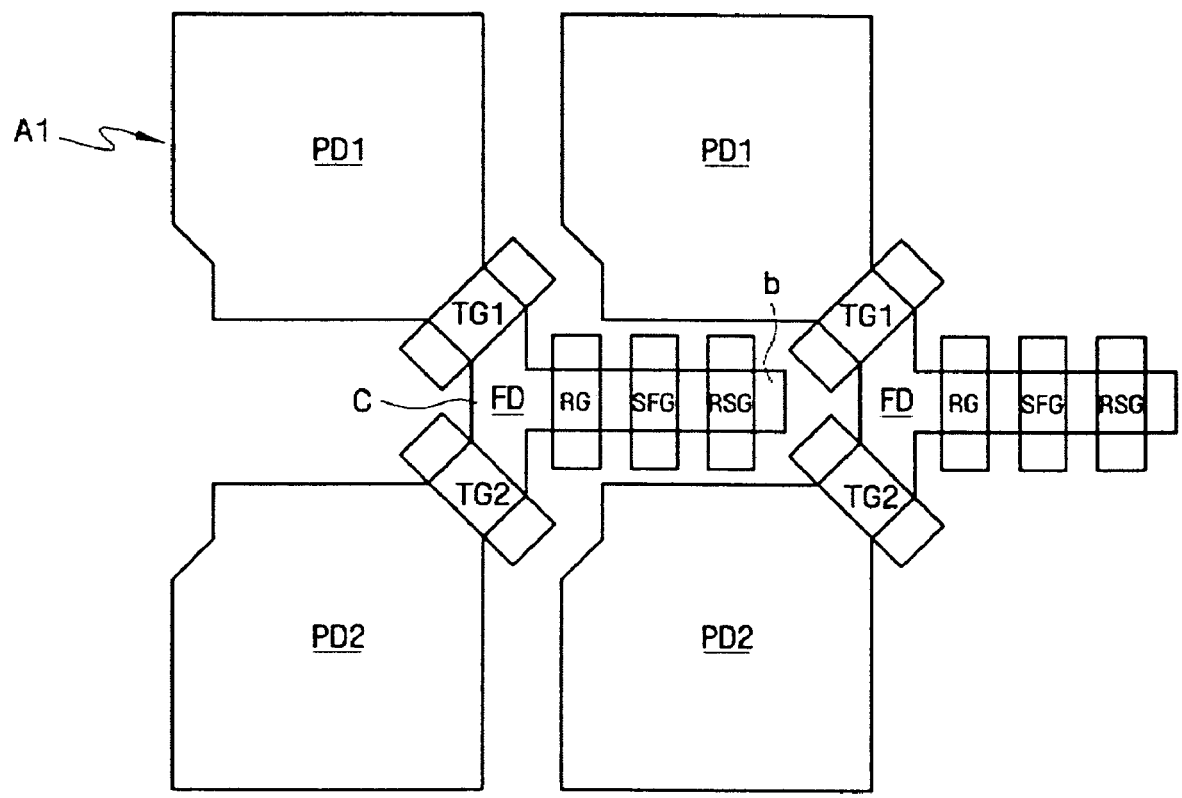
Figure 13A:
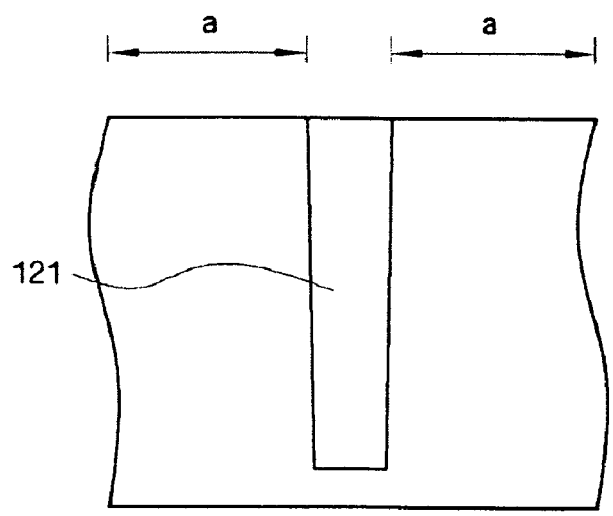
FIGS. 13A to 13E are sectional views illustrating the various shapes of a first isolation region constituting a 2-shared pixel image sensor according to some embodiments of the present invention.
Figure 13B:
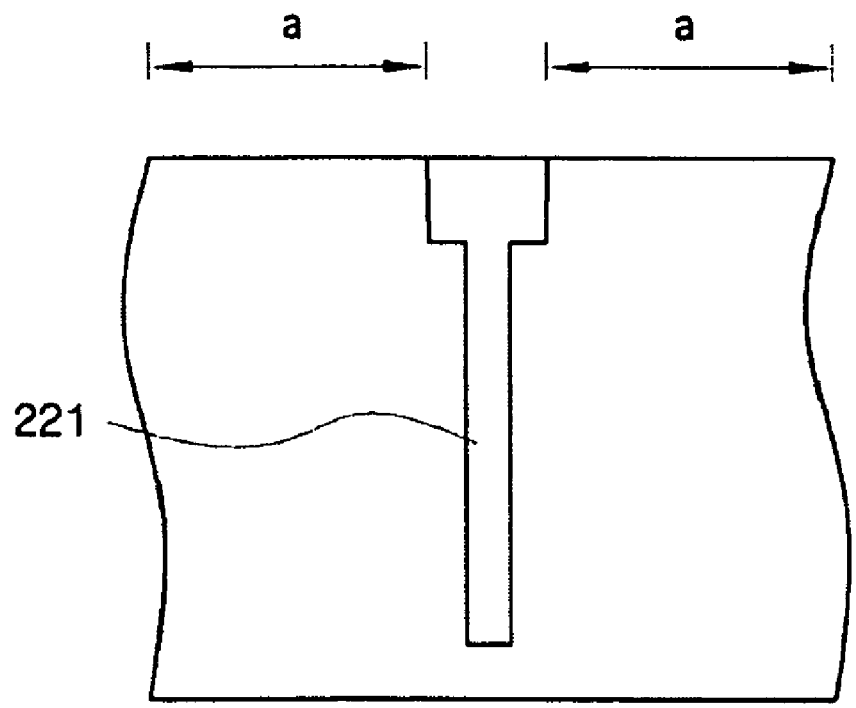
Figure 13C:
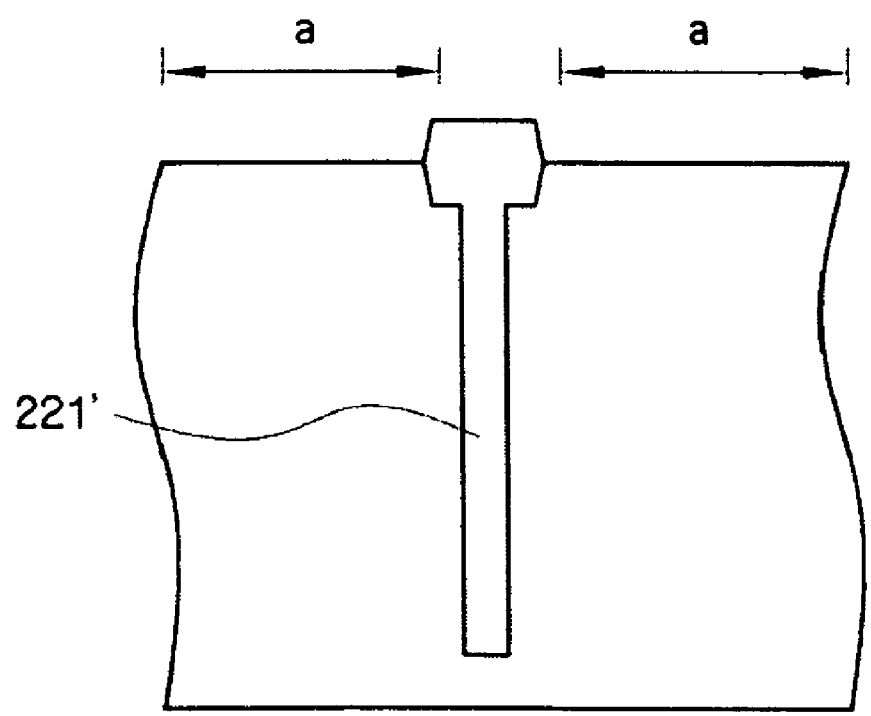
Figure 13D:
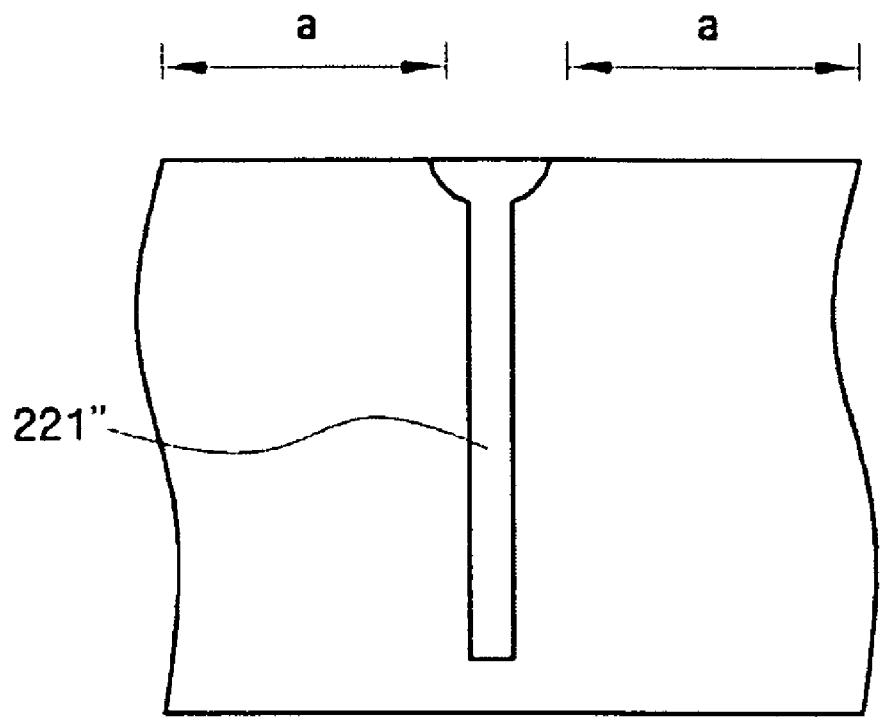
Figure 13E:
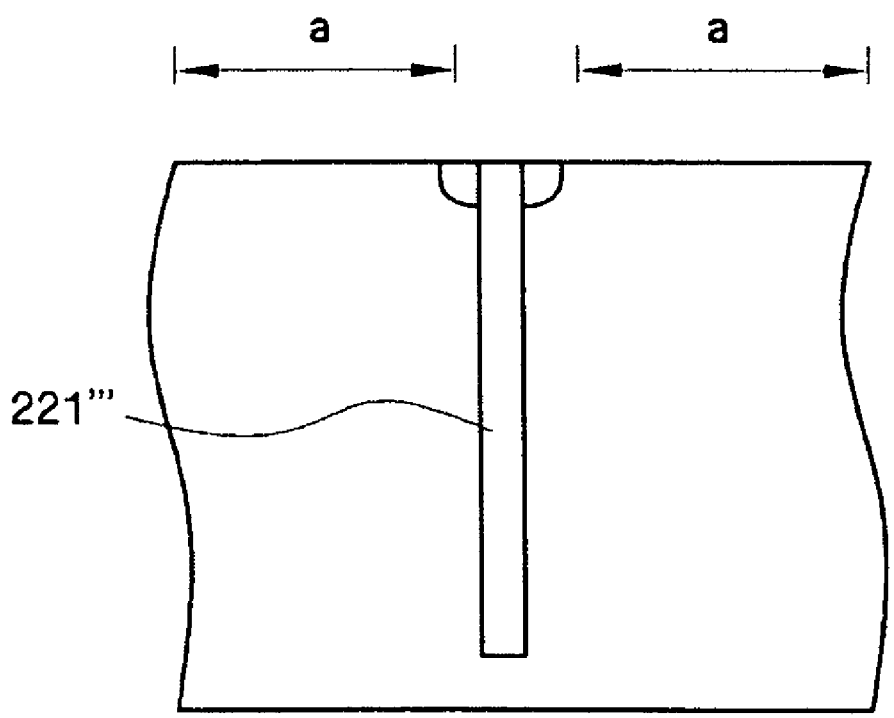

FIGS. 12A and 12B are layout diagrams for a 2-shared pixel image sensor according to embodiments of the present invention.

Referring to FIG. 12A, first active areas A1 each formed of two PDs PD1 and PD2 which share the floating diffusion region FD are arranged in a matrix, and an APS array 9 is configured in such a way that each first active area A1 is assigned with an independent read element active area A2. That is, the first and second active areas A1 and A2 constitute a unit active area of the 2-shared pixel.

The first active area A1 is a one axis merged dual lobe type active area. In detail, for the first active area A1, a dual lobe active area "a" is merged with an axis active area "b" through a connection active area "c". Each dual lobe active area is symmetrical with respect to the axis active area "b" in the column direction.

Two PDs PD1 and PD2 are formed in the dual lobe active area "a", and an FD and a reset element are formed in the connection active area "c" and the axis active area "b", respectively. A drive element and a select element are formed in the independent read element active area A2.

The layout illustrated in FIG. 12B is formed only of first active areas A1, that is, one axis merged dual lobe type active areas, without independent read element active areas, unlike the layout illustrated in FIG. 12A. A reset element, a drive element and a select element are formed in the axis active area "b" of the first active area A1.

Figure 14A:
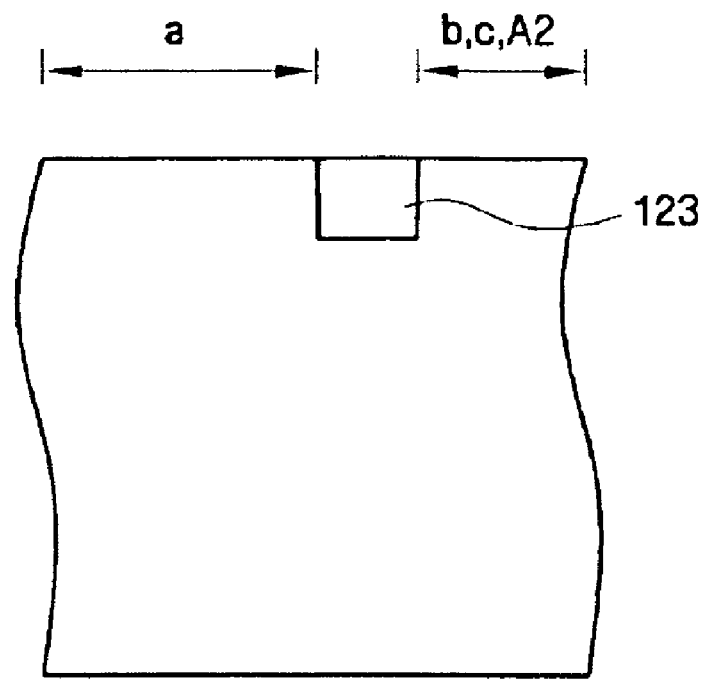
FIGS. 14A to 14C are sectional views illustrating various combinations of a second isolation region constituting a 2-shared pixel image sensor according to some embodiments of the present invention.
Figure 14B:
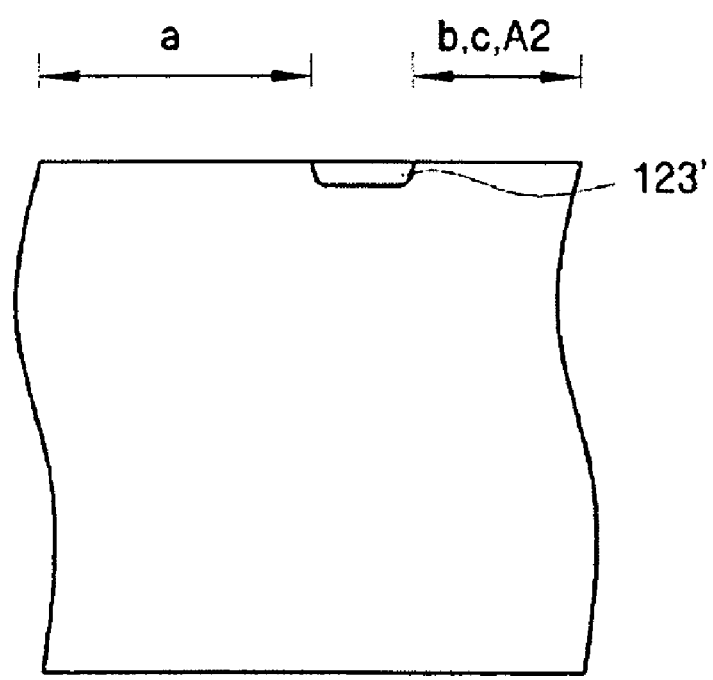
Figure 14C:
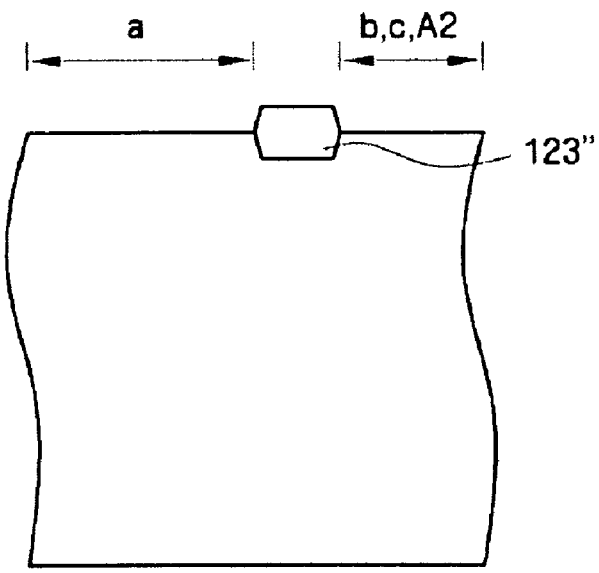

FIGS. 13A through 13E are sectional views illustrating additional embodiments of the first isolation region constituting a 2-shared pixel image sensor according to embodiments of the present invention. FIGS. 14A through 14C are sectional views illustrating additional embodiment of the second isolation region constituting a 2-shared pixel image sensor according to embodiments of the present invention.

Like the sectional view of the 4-shared pixel image sensor, respective active areas are defined by various combinations of the first and second isolation regions having various shapes illustrated in FIGS. 4 through 9C. In detail, each of first isolation regions 121, 221, 221', 221" and 221'" may be formed between the PD active area "a" and the PD active area "a" facing each other without the read element active area therebetween, as illustrated in FIGS. 13A through 13E, and each of second isolation regions 123, 123' and 123" may be formed among the PD active area "a", the read element active areas "b" and A2 and the floating diffusion region active area "c", as illustrated in FIGS. 14A through 14C.

Figure 15:
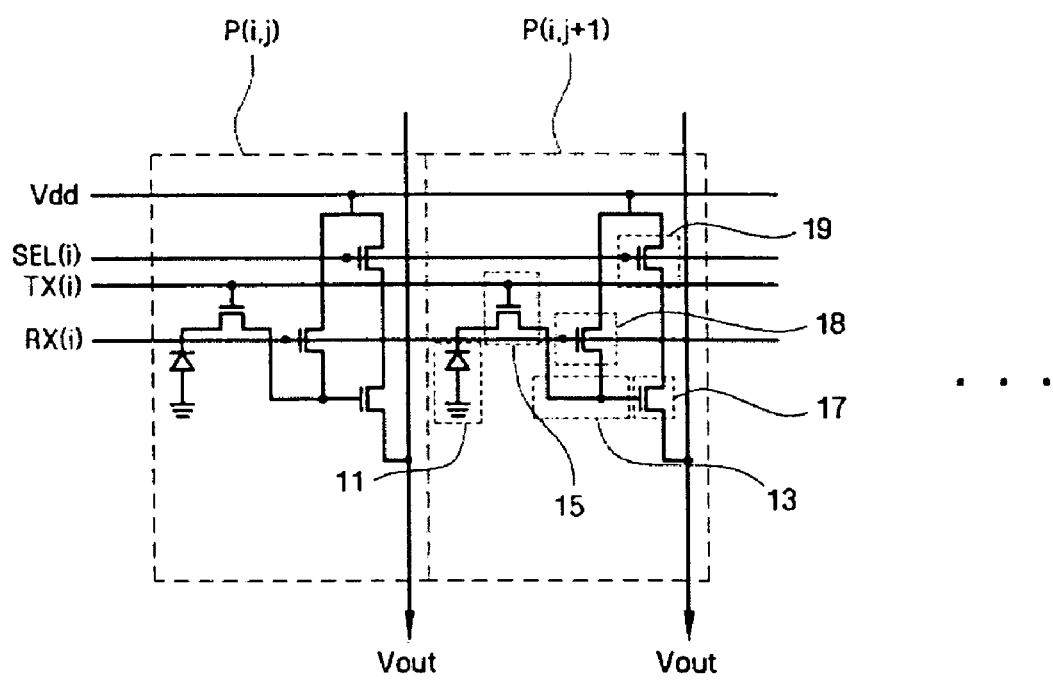
FIG. 15 is an equivalent circuit diagram of the active pixel sensor array of a non-shared pixel image sensor according to some embodiments of the present invention.

FIG. 15 is an equivalent circuit diagram of the active pixel sensor array of a non-shared pixel image sensor according to embodiments of the present invention.

Referring to FIG. 15, non-shared pixels P are arranged in the matrix, thus constituting an APS array 9. Each of the non-shared pixels P is provided with a drive element 17, a reset element 18 and a select element 19 for each PD 11, and a charge accumulated in each PD 11 is transmitted to an FD 13 by each charge transmission element 15.

Figure 16:
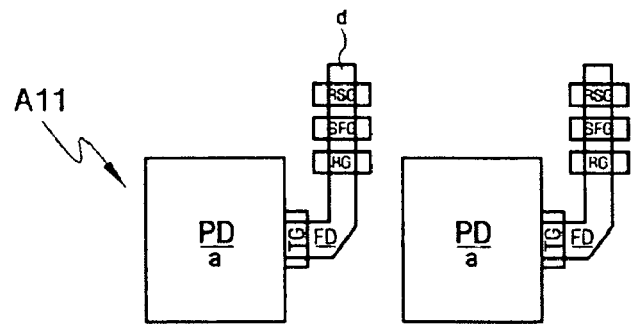
FIG. 16 is a layout of a non-shared pixel image sensor according to some embodiments of the present invention.

FIG. 16 is a layout diagram of a non-shared pixel image sensor according to embodiments of the present invention. Referring to FIG. 16, an active area A11 constitutes a unit active area of the non-shared pixel. The active area A11 includes a PD active area "a" in which each PD is formed, and a read element active area "d" which extends from the PD active area "a" and in which an FD, a reset element, a drive element and a select element are formed.

Although not shown in the drawing, respective active areas may be defined by the first and second isolation regions having various shapes illustrated in FIGS. 5A through 10C, like the sectional views of the 4-shared pixel image sensor. That is, a first isolation region may be formed between the PD active area "a" and the PD active area directly facing each other, and a second isolation region may be formed between the PD active area "a" and the floating diffusion region and read element active area "d".

Figure 17:
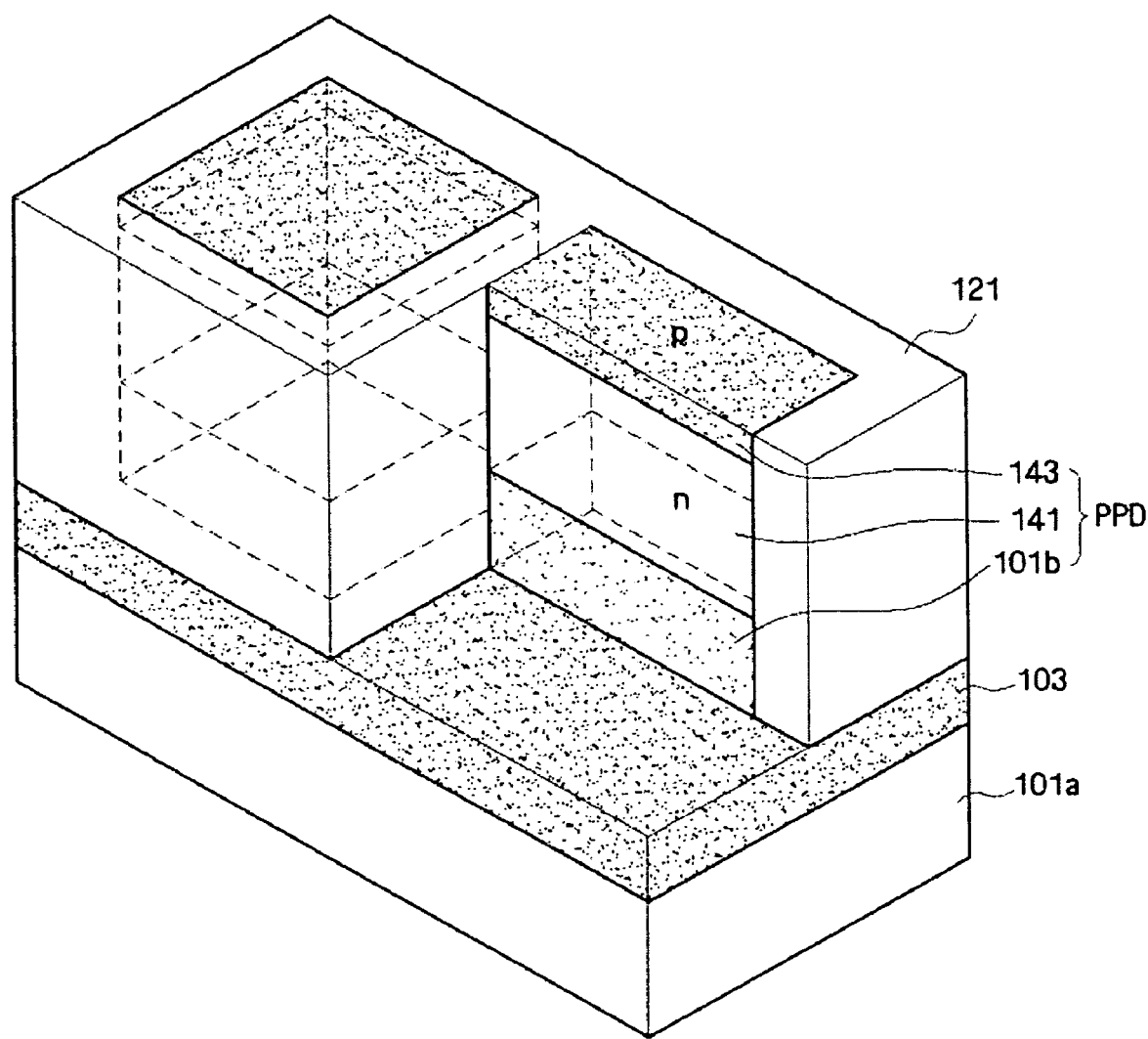
FIG. 17 is a partial perspective view of an image sensor according to some embodiments of the present invention.

FIG. 17 is a partial perspective view of an image sensor according to embodiments of the present invention. FIG. 17 illustrates am embodiment where all isolation regions are formed only of first isolation regions 121 illustrated in FIGS. 4 through 5D.

In the case where the gap between a PD active area and a read active area is sufficient or a processing margin for deep trench isolation region formation is sufficiently large, a PPD is completely enclosed by the first isolation region 121 and the p-type deep well 103 when all active areas are defined only by the first isolation region. Accordingly, it is possible to completely inhibit electrical and optical crosstalk. That is, adjacent PPDs are isolated from each other by the first isolation region 121 and the p-type deep well 103. The electrical and optical crosstalk is decreased and optical sensitivity is increased by combining a potential barrier comprised a first conductive type, for example, a p-type deep well 103 with first isolation regions 121 and 221 which are in contact with the potential barrier and function as electrical and optical crosstalk barriers.

Figure 18:
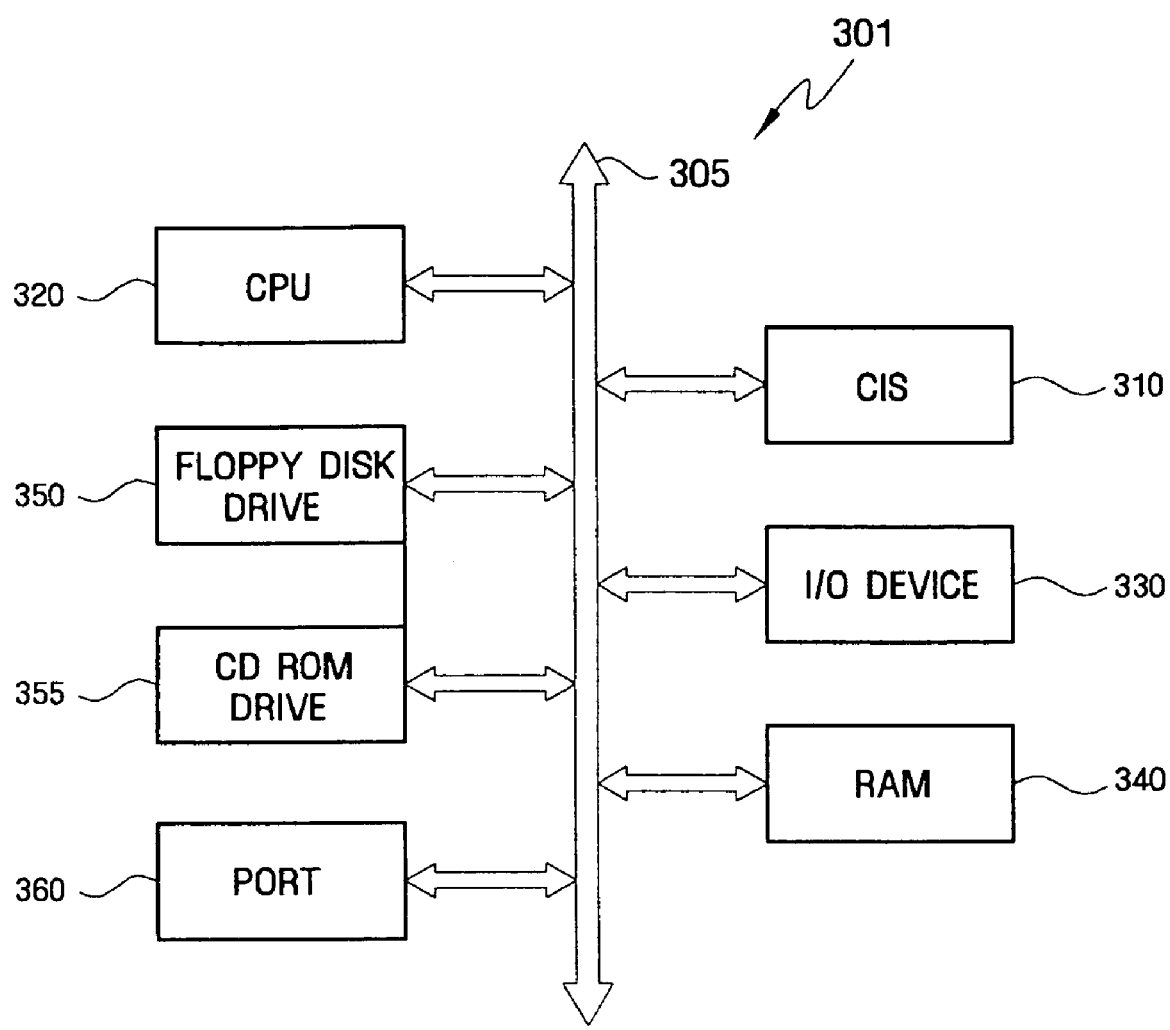
FIG. 18 is a schematic view illustrating a processor based system including a CMOS image sensor according to various embodiments of the present invention.

Although not shown in the drawings, the first isolation regions 221, 221', 221" and 221'" illustrated in FIGS. 7 and 9A through 9C can be employed in the same manner as shown in FIG. 18.

FIG. 18 is a schematic view showing a processor based system including a CIS according to embodiments of the present invention.

Referring to FIG. 18, the processor based system 301 is a system which processes an output image of the CIS 310. Although the system 301 may be exemplified as a computer system, a camera system, a scanner, a mechanical clock system, a navigation system, a video phone system, a monitoring system, an automatic focus system, a tracking system, an operation monitoring system, an image stabilization system, and the like, it is not limited to them.

The processor based system 301, such as a computer system, includes a central processing unit CPU 320 such as a microprocessor, which can communicate with an input/output device 330 through a bus 305. The CIS 310 can communicate with the system through the bus 305 or other communication links. Further, the processor based system 301 can further include RAM 340, a floppy disk drive 350 and/or a CD ROM drive 355, and a port 360 which can communicate with the CPU 320 through the bus 305. The port 360 may be a port which can couple a video card, a sound card, a memory card, and a USB device, or exchange data with another system. The CIS 310 can be integrated with a CPU, a Digital Signal Processor (DSP), or a microprocessor. Further, the CIS 310 can be integrated with memory. Of course, the CIS 310 may be provided on a separate chip different from the processor depending on the circumstances.

According to the CIS as described above, there are one or more of the following effects.

First, the sensitivity of the PD can be effectively increased by increasing the depth of the first isolation region because the depth of the first isolation region is the only parameter controlling the sensitivity.

Second, the crosstalk can be effectively reduced because the first isolation region can function as an electrical and optical crosstalk barrier.

Although the preferred embodiments of the present invention have been disclosed for illustrative purposes, those skilled in the art will appreciate that various modifications, additions and substitutions are possible, without departing from the scope and spirit of the invention as disclosed in the accompanying claims.

What is claimed is:

1. An image sensor comprising:
   a first isolation region formed in a substrate;
   a second isolation region formed with a depth less than a depth of the first isolation region;
   a plurality of photoelectric transducer devices isolated from one another by the first isolation region; and
   a read element and a floating diffusion region isolated from the photoelectric transducer devices by the second isolation region.

2. The image sensor of claim 1, wherein a portion of the second isolation region isolates the read element and the floating diffusion region of a first pixel from the photoelectric transducer device of a second pixel adjacent to the first pixel.

3. The image sensor of claim 1, wherein the first isolation region comprises a trench isolation region.

4. The image sensor of claim 3, wherein the first isolation region comprises a lower trench isolation region and an upper wide isolation region formed on an upper portion of the lower trench isolation region, such that an eave portion is formed by portions of the upper wide isolation region extending beyond the width of the lower trench isolation region.

5. The image sensor according to claim 4, wherein the upper wide isolation region comprises a LOCOS oxide film, or a trench isolation region having a width greater than the width of the lower trench isolation region.

6. The image sensor of claim 1, wherein the second isolation region comprises a trench isolation region, a LOCOS oxide film, or a p-type junction region.

7. The image sensor of claim 1, wherein the depth of the first isolation region is equal to or greater than 2 µm.

8. The image sensor of claim 1, further comprising:
   a first conductive type impurity layer formed in the substrate and spaced apart from the surface of the substrate.

9. The image sensor according to claim 8, wherein a bottom surface of the first isolation region is formed with a depth greater than the depth of the first conductive type impurity layer in the substrate.

10. The image sensor of claim 1, wherein the first isolation region is filled with a material having a refractive index which is lower than that of the substrate.

11. The image sensor of claim 1, further comprising a first conductive type impurity region formed on sidewall and bottom surfaces of the first isolation region.

12. The image sensor of claim 1, wherein the photoelectric transducer device comprises a first conductive type impurity region, and a second conductive type impurity region formed under the first conductive type impurity region.

13. An image sensor comprising:
    a first conductive type impurity layer formed in a substrate and spaced apart from a surface of the substrate;
    a trench isolation region extending from the surface of the substrate to the first conductive type impurity layer; and
    a plurality of photoelectric transducer devices optically and electrically isolated from one another by the trench isolation region and the first conductive type impurity layer,
    wherein a bottom of the trench isolation region is formed to a depth greater than a depth of the first conductive type impurity layer in the substrate.

14. The image sensor of claim 13, further comprising:
    an isolation region having a depth less than that of the trench isolation region in the substrate; and
    a read element and a floating diffusion region isolated from the photoelectric transducer devices by the shallower isolation region.

15. The image sensor of claim 14, wherein a portion of the shallower isolation region isolates a read element and floating diffusion region of a first pixel from a photoelectric transducer device of a second pixel adjacent to the first pixel.

16. The image sensor of claim 14, wherein the shallower isolation region includes a trench isolation region, a LOCOS oxide film or a p-type junction region.

17. The image sensor of claim 13, wherein the trench isolation region comprises a lower trench isolation region and an upper wide isolation region formed on an upper portion of the lower trench isolation region, such that an eave portion is formed by portions of the upper wide isolation region extending beyond the width of the lower trench isolation region.

18. The image sensor of claim 17, wherein the upper wide isolation region comprises an extended portion of an opening of a trench isolation region, a LOCOS oxide film or the lower trench isolation region.

19. The image sensor of claim 13, wherein the depth of the trench isolation region is equal to or greater than 2 µm.

20. The image sensor of claim 13, wherein the trench isolation region is filled with a material having a refractive index which is lower than that of the substrate.

21. The image sensor of claim 13, further comprising:
    a first conductive type impurity region formed on sidewall and bottom surfaces of the trench isolation region.

22. The image sensor of claim 13, wherein the photoelectric transducer device comprises a first conductive type impurity region, and a second conductive type impurity region formed under the first conductive type impurity region.

23. The image sensor of claim 8, wherein the first isolation region extends from an upper surface of the substrate to the first conductive type impurity layer.

* * * * *